United States Patent
Ryu et al.

(10) Patent No.: US 11,526,060 B2
(45) Date of Patent: Dec. 13, 2022

(54) DISPLAY DEVICE

(71) Applicant: Samsung Display Co., Ltd., Yongin-Si (KR)

(72) Inventors: Gwon-Heon Ryu, Cheonan-si (KR); Yang Gyu Jang, Cheonan-si (KR); Kook Hyun Choi, Asan-si (KR); Beom Jun Kim, Seoul (KR); Hyung Gi Jung, Cheonan-si (KR)

(73) Assignee: Samsung Display Co., Ltd.

(*) Notice: Subject to any disclaimer, the term of this patent is extended or adjusted under 35 U.S.C. 154(b) by 145 days.

(21) Appl. No.: 17/066,576

(22) Filed: Oct. 9, 2020

(65) Prior Publication Data

US 2021/0240045 A1  Aug. 5, 2021

(30) Foreign Application Priority Data

Feb. 3, 2020 (KR) .................. 10-2020-0012579

(51) Int. Cl.
*G02F 1/1362* (2006.01)
*G02F 1/1368* (2006.01)
*H01L 27/12* (2006.01)

(52) U.S. Cl.
CPC ...... *G02F 1/136286* (2013.01); *G02F 1/1368* (2013.01); *H01L 27/1244* (2013.01); *G02F 1/13629* (2021.01)

(58) Field of Classification Search
CPC ................................. G02F 1/136286
See application file for complete search history.

(56) References Cited

U.S. PATENT DOCUMENTS

| 2015/0294618 A1* | 10/2015 | Park ............... G09G 3/3291 345/78 |
| 2017/0031191 A1* | 2/2017 | Choi .............. G02F 1/136204 |
| 2020/0285089 A1* | 9/2020 | Lee ..................... G02F 1/1337 |

FOREIGN PATENT DOCUMENTS

| JP | 2003-172945 A | 6/2003 |
| KR | 10-0659048 B1 | 12/2006 |
| KR | 10-1685409 B1 | 12/2016 |
| KR | 10-2017-0127109 A | 11/2017 |
| KR | 10-2019-0052327 A | 5/2019 |

* cited by examiner

*Primary Examiner* — Sang V Nguyen
(74) *Attorney, Agent, or Firm* — Innovation Counsel LLP

(57) ABSTRACT

The present disclosure relates to a display device including a substrate, a gate line on the substrate, a data line crossing the gate line, a pixel connected to the gate line and the data line, and a dummy data line disposed at an edge on the substrate and crossing the gate line, wherein the dummy data line includes openings that is disposed on a portion that is near an overlapping portion with the gate line, and portions of the dummy data line separated by the openings are electrically insulated from each other.

20 Claims, 16 Drawing Sheets

DISPLAY DEVICE

CROSS-REFERENCE TO RELATED APPLICATION

This application claims priority to and the benefit of Korean Patent Application No. 10-2020-0012579 filed in the Korean Intellectual Property Office on Feb. 3, 2020, the entire contents of which are incorporated herein by reference.

BACKGROUND

1. Field

Generally, the present disclosure relates to a display device. More particularly, the present disclosure relates to a display device for preventing a short circuit from being generated between wires disposed on different layers in a predetermined region.

2. Description of the Related Art

A display device is a device for displaying images, and it includes a liquid crystal display (LCD) and an organic light emitting diode (OLED). The display device is used with various electronic devices such as a cell phone, a GPS, a digital camera, an electronic book, a portable game device, or various terminals.

The display device may include various wires disposed on different layers. The wires may be insulated by an insulating layer. The display device is manufactured by undergoing multiple depositions and etching processes, and defects may be generated in the processes. For example, the wires disposed on different layers and electrically insulated from each other may be electrically connected to each other.

A test for detecting the above-noted defect is performed in many stages, and when detection of defects is performed not in the earlier stage but in the later stage and the device is discarded, and a loss cost increases. This may correspond to the case in which the defect generated in the earlier stage is not found in the test and is missed. In another way, it may be a case in which no defect is generated in the earlier stage, but a defect is generated by undergoing a process such as a high voltage stress test.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a display device for preventing a short-circuit from being generated between wires disposed on different layers in a predetermined region.

An example embodiment provides a display device including: a substrate; a gate line on the substrate; a data line crossing the gate line; a pixel connected to the gate line and the data line; and a dummy data line disposed at an edge of the substrate and crossing the gate line, wherein the dummy data line includes openings that are disposed on a portion that is near an overlapping portion with the gate line, and portions of the dummy data separated by the openings of the dummy data line are electrically insulated from each other.

The openings of the dummy data line may include: an upper opening disposed on an upper side of an overlapping portion with the gate line in a plan view; and a lower opening disposed on a lower side of an overlapping portion with the gate line in a plan view.

A number of openings of the dummy data line may be greater than a number of the gate lines.

The number of openings of the dummy data line may be about twice the number of the gate lines.

The display device may further include a gate insulating layer between the gate line and the data line and between the gate line and the dummy data line, wherein the gate line overlaps the data line with the gate insulating layer therebetween, and the gate line overlaps the dummy data line with the gate insulating layer therebetween.

The gate line may extend in a first direction, the data line may extend in a second direction that is perpendicular to the first direction, and the dummy data line may extend in the second direction.

The display device may further include a dummy pixel disposed at an edge on the substrate and disposed between the data line and the dummy data line, wherein the dummy pixel floats.

The dummy data line may float.

The display device may include a plurality of gate lines, a plurality of data lines, and a plurality of pixels, the pixels may be disposed in a matrix form, each of the gate lines may be connected to a pixel in a same row from among the pixels, and each of the data lines may be alternately connected to a pixel on a left of the data line and a pixel on a right of the data line from among the pixels.

Data voltages with different polarities may be applied to data lines that are adjacent to each other from among the data lines.

The display device may further include a dummy reference voltage line disposed at an edge of the substrate, and crossing the gate line, wherein the dummy reference voltage line may include openings disposed on a portion that is near an overlapping portion with the gate line, and portions of the dummy reference voltage line separated by the openings may be electrically insulated from each other.

The data line may include a first data line and a second data line, the dummy data line may include a first dummy data line and a second dummy data line, and the first dummy data line and the second dummy data line may respectively include an opening disposed on a portion that is near an overlapping portion with the gate line.

Another embodiment provides a display device including: a substrate; a gate line disposed on the substrate; a data line and a reference voltage line crossing the gate line; a pixel connected to the gate line, the data line, and the reference voltage line; and a dummy reference voltage line disposed at an edge of the substrate, and crossing the gate line, wherein the dummy reference voltage line may include openings disposed on a portion that is near the overlapping portion with the gate line, and portions of the dummy reference voltage line separated by the openings may be electrically insulated from each other.

The display device may further include a dummy data line disposed at an edge on the substrate and crossing the gate line, wherein the dummy reference voltage line may be disposed between the dummy data line and the data line.

The dummy data line may include openings disposed on a portion that is near an overlapping portion with the gate line, and portions of the dummy data line separated by the openings may be electrically insulated from each other.

The display device may further include a dummy pixel disposed at an edge of the substrate and disposed between the data line and the dummy data line, wherein the dummy pixel may float.

The dummy reference voltage line and the dummy data line may float.

The openings of the dummy reference voltage line may include an upper opening disposed on an upper side of an overlapping portion with the gate line in a plan view, and a lower opening disposed on a lower side of an overlapping portion with the gate line in a plan view.

Yet another embodiment provides a display device including: a substrate; a gate line and a data line disposed on the substrate and crossing each other; a reference voltage line disposed on the substrate and receiving a predetermined voltage; a first transistor and a second transistor connected to the gate line and the data line; a third transistor connected to the gate line, the second transistor, and the reference voltage line; a first sub-pixel electrode connected to the first transistor; a second sub-pixel electrode connected to the second transistor; and a dummy data line disposed at an edge on the substrate and crossing the gate line, wherein the dummy data line may include openings disposed on a portion that is near an overlapping portion with the gate line, and portions of the dummy data line separated by openings may be electrically insulated from each other.

The display device may further include a dummy reference voltage line disposed at an edge of the substrate and crossing the gate line, wherein the dummy reference voltage line may include an opening disposed on a portion that is near an overlapping portion with the gate line, and portions of the dummy reference voltage line separated by the openings of the dummy reference voltage line may be electrically insulated from each other.

According to the example embodiments, the cost may be reduced by preventing generation of a short-circuit between the wires disposed on the different layers in a predetermined region of the display device.

DETAILED DESCRIPTION

Figure 1:
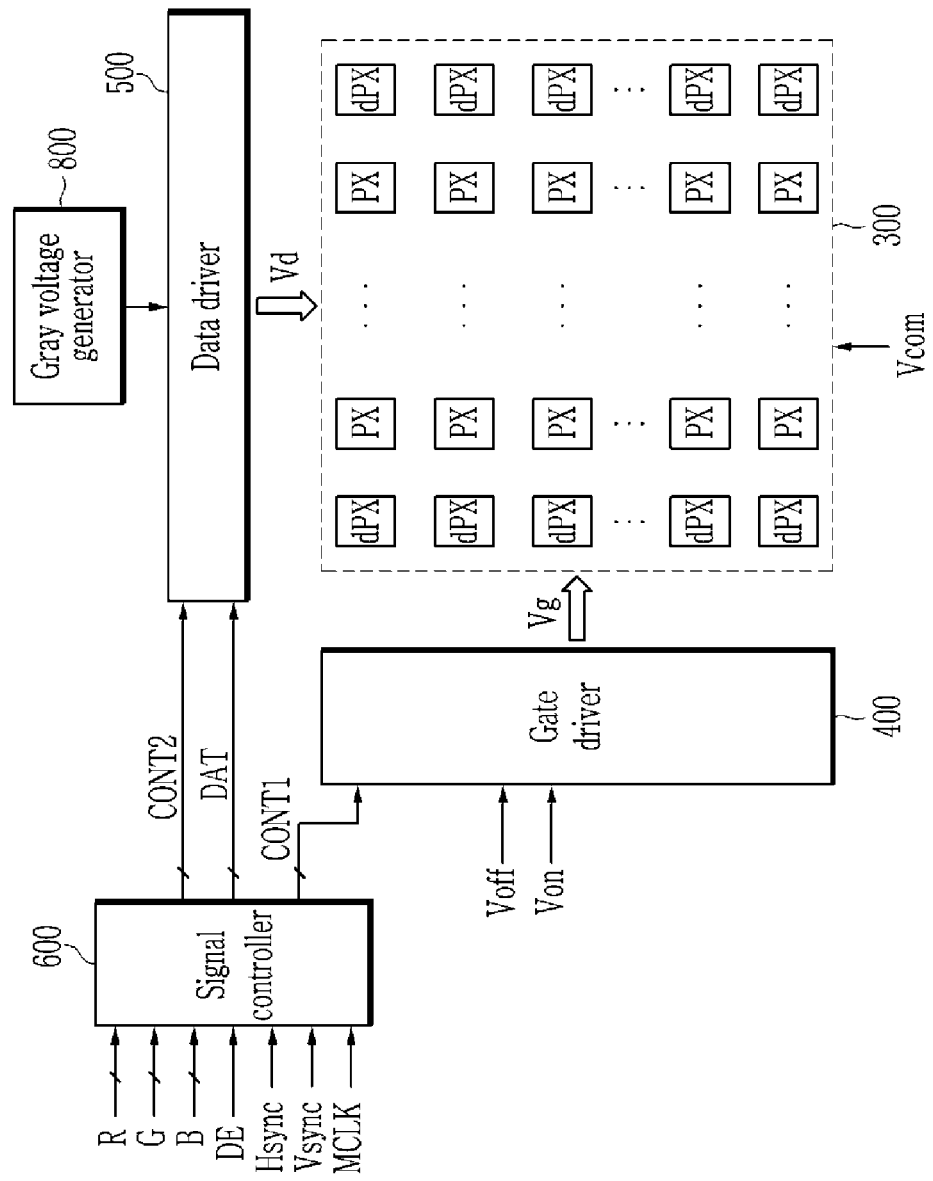
FIG. 1 shows a block diagram of a display device according to an example embodiment.

The present disclosure will be described more fully hereinafter with reference to the accompanying drawings, in which example embodiments of the present disclosure are shown. As those skilled in the art would realize, the described embodiments may be modified in various different ways, all without departing from the spirit or scope of the present disclosure.

The drawings and description are to be regarded as illustrative in nature and not restrictive, and like reference numerals designate like elements throughout the specification.

Further, the size and thickness of each configuration shown in the drawings are arbitrarily shown for better understanding and ease of description, and the present disclosure is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

A display device according to an exemplary embodiment will now be described with references to FIG. 1 and FIG. 2.

Figure 2:
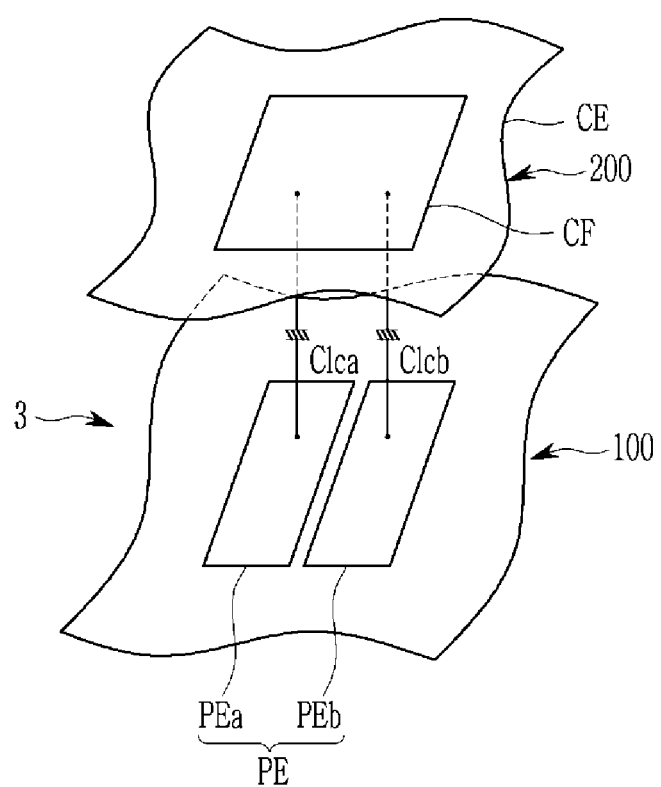
FIG. 2 shows an equivalent circuit diagram of a pixel together with a structure of a display device shown in FIG. 1.

FIG. 1 shows a block diagram of a display device according to an example embodiment, and FIG. 2 shows an equivalent circuit diagram of a pixel together with a structure of a display device shown in FIG. 1.

As shown in FIG. 1, the display device includes a liquid crystal panel assembly 300, a gate driver 400 and a data driver 500 connected to the liquid crystal panel assembly 300, a gray voltage generator 800 connected to the data driver 500, and a signal controller 600 for controlling them.

In an equivalent circuit viewpoint, the liquid crystal panel assembly 300 includes a plurality of signal lines (not shown) and a plurality of pixels PX connected thereto and substantially arranged in a matrix form. A dummy pixel (dPX) may further be disposed on both edges of the liquid crystal panel assembly 300. For example, a plurality of dummy pixels (dPX) may be disposed on a leftmost edge and a rightmost edge of the column direction of the liquid crystal panel assembly 300 in a column direction.

In a viewpoint of the configuration described with reference to FIG. 2, the liquid crystal panel assembly 300 includes a thin film transistor array panel 100, an opposite display panel 200, and a liquid crystal layer 3 disposed between the display panel 100 and the opposite display panel 200.

Signal lines include a plurality of gate lines (not shown) for transmitting a gate signal (Vg, also referred to as a scanning signal) and a plurality of data lines (not shown) for transmitting a data voltage (Vd). The gate lines substantially extend in the row direction and are substantially in parallel with each other, and the data lines substantially extend in the column direction and are substantially in parallel with each other.

Each pixel PX may include a pair of subpixels, and each subpixel may include liquid crystal capacitors (Clca and Clcb). At least one of the two subpixels may include a gate line, a data line, and a switching element (not shown) connected to the liquid crystal capacitors (Clca and Clcb).

The liquid crystal capacitors (Clca and Clcb) include first and second sub-pixel electrodes (PEa/PEb) of the thin film transistor array panel 100 and a common electrode (CE) of the opposite display panel 200 as two terminals, and the liquid crystal layer 3 disposed between the first and second sub-pixel electrode (PEa/PEb) and the common electrode (CE) function as a dielectric material. The first and second sub-pixel electrodes (PEa/PEb) are separated from each other and configure one pixel electrode (PE). The common electrode (CE) may be formed on an entire side of the opposite display panel 200, and may receive a common voltage Vcom. The liquid crystal layer 3 may have negative dielectric anisotropy.

On the other hand, to realize color displaying, each pixel PX may be allowed to uniquely display one of primary colors (i.e., spatial division) or the pixel PX may be allowed to alternately display the primary colors (i.e., temporal division) so that the desired color may be recognized with a spatial and temporal sum of the primary colors. The primary colors, for example, include red, green, and blue colors. FIG. 2 shows one example of spatial division, showing that each pixel PX includes a color filter (CF) for expressing one of the primary colors in the region of the opposite display panel 200. Unlike FIG. 2, the color filter (CF) may be above or below the first and second sub-pixel electrodes (PEa and PEb) of the thin film transistor array panel 100.

At least one polarizer (not shown) for polarizing light may be attached to an outside of the liquid crystal panel assembly 300.

Referring back to FIG. 1, the gray voltage generator 800 generates all gray voltages or a limited number of gray voltages (referred to as a reference gray voltages) relating to transmittance of the pixel PX. The (reference) gray voltage may include one having a positive value and another having a negative value for the common voltage Vcom.

The gate driver 400 is connected to the gate line of the liquid crystal panel assembly 300 and applies a gate signal (Vg) that is a combination of the gate-on voltage Von and the gate-off voltage Voff to the gate line.

The data driver 500 is connected to the data line of the liquid crystal panel assembly 300, and it selects the gray voltage generated by the gray voltage generator 800 and applies the same to the data line as a data voltage (Vd). However, when the gray voltage generator 800 does not provide the voltages of all the grays but provides a predetermined number of reference gray voltages, the data driver 500 divides the reference gray voltage to generate a gray voltage for the entire grays, and selects the data voltage (Vd) among them.

The signal controller 600 may control the gate driver 400 and the data driver 500.

The driving devices 400, 500, 600, and 800 may respectively be installed as at least one IC chip on the liquid crystal panel assembly 300, may be installed on a flexible printed circuit film (not shown) and may be attached in a tape carrier package (TCP) to the liquid crystal panel assembly 300, or may be installed on an additional printed circuit board (PCB) (not shown). Unlike this, the driving devices 400, 500, 600, and 800 together with the signal lines and the switching elements may be integrated on the liquid crystal panel assembly 300. Further, the driving devices 400, 500, 600, and 800 may be integrated into a single chip, and in this case, at least one of them or at least one circuit may be positioned outside of the single chip.

A connection relationship between a plurality of pixels and signal lines disposed on the display device, and a dummy pixel according to an example embodiment, will now be described with reference to FIG. 3.

Figure 3:
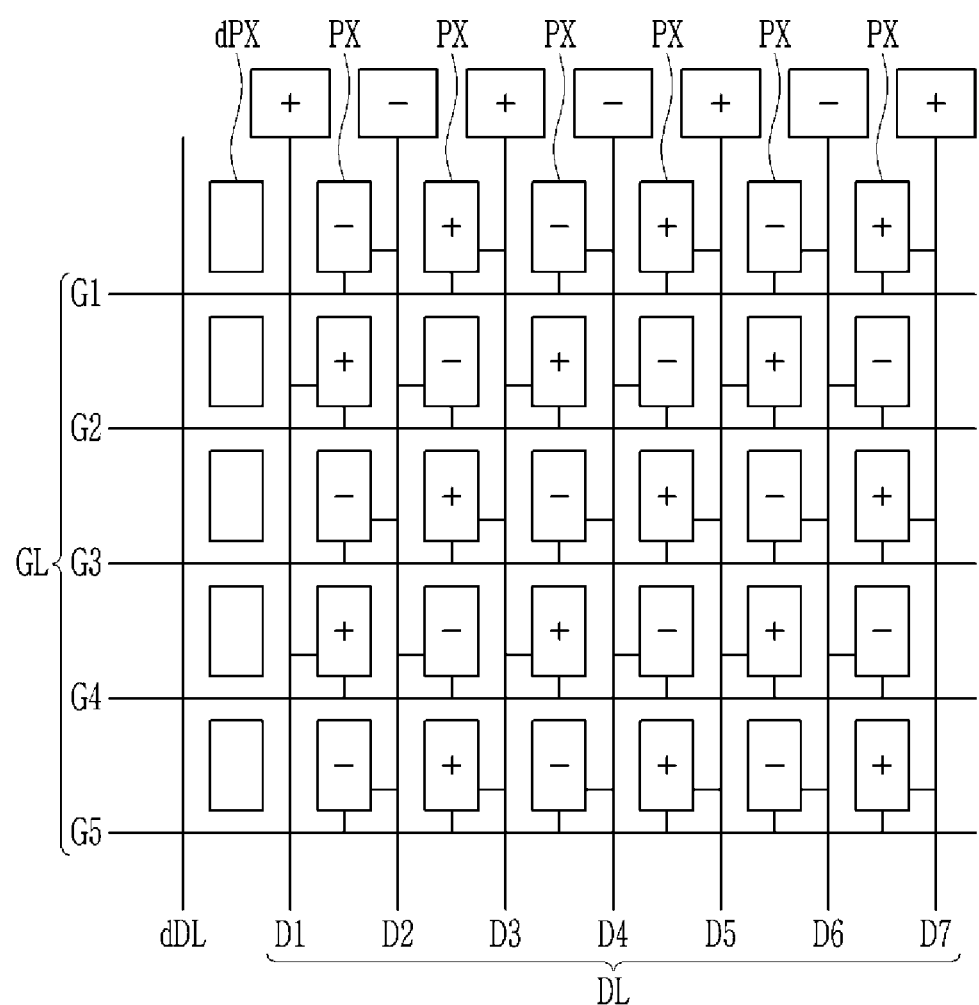
FIG. 3 shows a connection relationship between a pixel of a display device according to an example embodiment and signal lines.

FIG. 3 shows a connection relationship between a pixel of a display device according to an example embodiment and signal lines. FIG. 3 illustrates some pixels (PXs) from among a plurality of pixels (PXs) of the display device according to an example embodiment, and particularly shows some dummy pixels (dPX) disposed on the left edge of the display device, adjacent pixels, and signal lines connected thereto.

A plurality of gate lines (GL) may include a first gate line G1, a second gate line G2, a third gate line G3, a fourth gate line G4, and a fifth gate line G5 substantially extending in the row direction. A plurality of data lines (DL) may include a first data line D1, a second data line D2, a third data line D3, a fourth data line D4, a fifth data line D5, a sixth data line D6, and a seventh data line G7 crossing the gate lines and substantially extending in the column direction. A dummy data line (dDL) is near the first data line D1 which is disposed to the leftmost side of a plurality of data lines (DL).

A plurality of pixels PX may be substantially disposed in a matrix form in the row direction and the column direction. Each pixel PX is connected to the gate line (GL) and the data line (DL). The gate lines (GL) are connected to the pixel PXs disposed on the same row from among a plurality of pixels PX. For example, the first gate line G1 is connected to the pixel PX in the first row, the second gate line G2 is connected to the pixel PX in the second row, and the third gate line G3 is connected to the pixel PX in the third row.

The data line (DL) is alternately connected to the pixel PX disposed on the left of the data line (DL) and the pixel PX disposed on the right of the data line (DL) among a plurality of pixels PX. The first data line D1 is connected to the pixels PX in the second row and the fourth row from among the pixels PX in the first column. The second data line D2 is connected to the pixels PX in the first row, the third row, and the fifth row from among the pixels PX in the first column, and it is connected to the pixels PX in the second row and the fourth row from among the pixels PX in the second column. The third data line D3 is connected to the pixels PX in the first row, the third row, and the fifth row from among the pixels PX in the second column, and it is connected to the pixels PX in the second row and the fourth row from among the pixels PX in the third column.

A dummy pixel (dPX) may be provided so that it may be positioned adjacent to the pixel PX in the first column. In this instance, the dummy pixel (dPX) may be located to the left of the first data line (D1). The dummy pixel (dPX) may be disposed between the dummy data line (dDL) and the data line (DL). In this instance, the dummy pixel (dPX) may be disposed between the dummy data line (dDL) and the first data line D1. The dummy pixel (dPX) may be disposed in the column direction. The dummy pixel (dPX) is not connected to the gate line (GL), the data line (DL), or the dummy data line (dDL). The dummy pixel (dPX) floats.

A gate signal may be applied to the gate line (GL), and a data voltage may be applied to the data line (DL). The data voltage may be configured with a positive polarity and a negative polarity. No signal is applied to the dummy data line (dDL). The dummy data line (dDL) floats.

A positive-polarity data voltage may be applied to some data lines (DL), and negative-polarity data voltage may be applied to other data lines (DL). In this instance, the data voltages with different polarities may be applied to the data lines (DL) that are adjacent to each other. For example, the positive-polarity data voltage may be applied to the first data line D1, the third data line D3, the fifth data line D5, and the seventh data line D7, and the negative-polarity data voltage may be applied to the second data line D2, the fourth data line D4, and the sixth data line D6. In the next frame, the negative-polarity data voltage may be applied to the first data line D1, the third data line D3, the fifth data line D5, and the seventh data line D7, and the positive-polarity data voltage may be applied to the second data line D2, the fourth data line D4, and the sixth data line D6. In this instance, the data lines (DL) are not only connected to the pixels PX in the same column, but are alternately connected to the pixels PX disposed on the right and the left, so the pixels PX in the same column may have different polarities. That is, an effect of dot inversion may be obtained through column inversion driving.

When capacitance with the data lines disposed on respective sides of the pixels PX in the same column is a symmetric in the above-noted structure, defects according to variation of an RC delay may be visible. Regarding the display device according to an example embodiment, the dummy data line (dDL) is disposed so that it may be near the pixel PX disposed on the edge, for example, the pixel PX in the first column, thereby allowing capacitance formed on the right and left to be symmetric. Further, when a process such as an exposure is performed, an outermost pattern may be formed to be thin, which is a defect. Regarding the display device according to an example embodiment, the pattern defect may be prevented by disposing the dummy data line (dDL) and the dummy pixel PX on the respective edges.

A display device according to an example embodiment will now be described with reference to FIG. 4.

Figure 4:
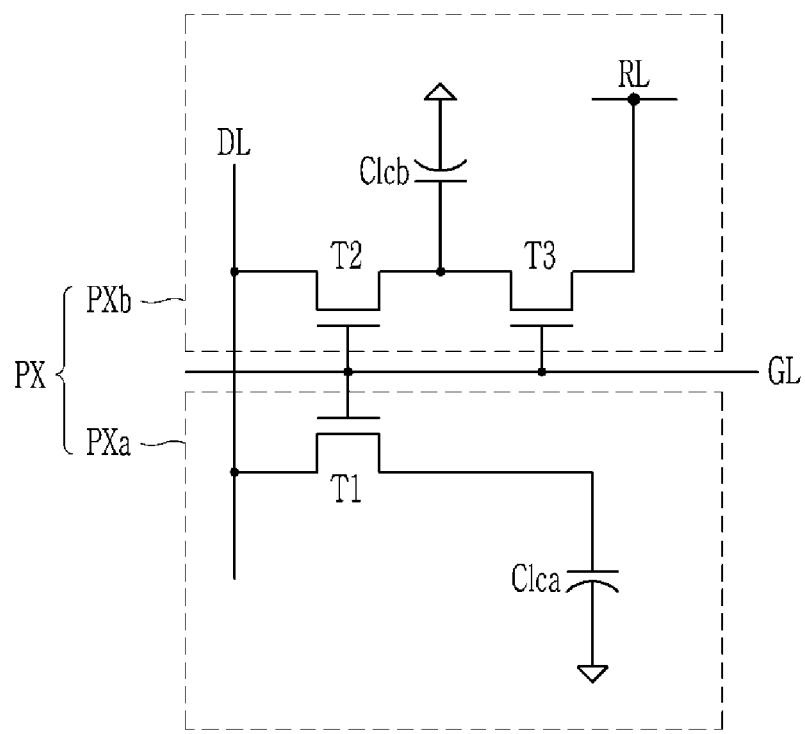
FIG. 4 shows an equivalent circuit diagram of a pixel of a display device according to an example embodiment.

FIG. 4 illustrates an equivalent circuit diagram of a pixel of a display device according to an example embodiment.

The display device according to an example embodiment includes a plurality of signal lines GL, DL, and RL, and a plurality of pixels PX connected to the signal lines.

The signal lines GL, DL, and RL include a gate line (GL) for transmitting a gate signal, a data line (DL) for transmitting a data voltage, and a reference voltage line (RL) for receiving a predetermined voltage.

A first switching element T1 and a second switching element T2 connected to the same gate line (GL) and the same data line (DL) are disposed. In addition, a third switching element T3 connected to the same gate line (GL) as the first and second switching elements T1 and T2 and connected to the second switching element T2 and the reference voltage line (RL) is further formed. The first, second, and third switching elements T1, T2, and T3 may be configured with thin film transistors.

Each pixel PX includes two subpixels (PXa and PXb), and a first liquid crystal capacitor (Clca) connected to the first switching element T1 is formed on the first subpixel (PXa), while a second liquid crystal capacitor (Clcb) connected to the second switching element T2 is formed on the second subpixel (PXb).

The first switching element T1 includes a first terminal connected to the gate line (GL), a second terminal connected to the data line (DL), and a third terminal connected to the first liquid crystal capacitor (Clca). In this instance, the third terminal of the first switching element T1 may be connected to the first sub-pixel electrode (PEa) configuring the first liquid crystal capacitor (Clca).

The second switching element T2 includes a first terminal connected to the gate line (GL), a second terminal connected to the data line (DL), and a third terminal connected to the second liquid crystal capacitor (Clcb). In this instance, the third terminal of the second switching element T2 may be connected to the second sub-pixel electrode (PEa) configuring the second liquid crystal capacitor (Clcb).

The third switching element T3 includes a first terminal connected to the gate line (GL), a second terminal connected to the reference voltage line (RL), and a third terminal connected to the third terminal of the second switching element T2 and the second liquid crystal capacitor (Clcb).

Regarding an operation of the display device according to an example embodiment, when a gate-on voltage is applied to the gate line (GL), the first, second, and third switching elements T1, T2, and T3 connected thereto are turned on, and the first liquid crystal capacitor (Clca) and the second liquid crystal capacitor (Clcb) are charged by the data voltage received through the data line (DL).

In this instance, as the third switching element T3 is turned on, the data voltage transmitted to the second subpixel (PXb) through the data line (DL) is divided by the third switching element T3 coupled in series to the second switching element T2. In this instance, the voltage is divided according to the size of channels of the second switching element T2 and the third switching element T3. Therefore, when the same data voltage is transmitted to the first subpixel (PXa) and the second subpixel (PXb) through the data line (DL), the voltage charged in the first liquid crystal capacitor (Clca) becomes different from the voltage charged in the second liquid crystal capacitor (Clcb). That is, the voltage charged in the second liquid crystal capacitor (Clcb) is lower than the voltage charged in the first liquid crystal capacitor (Clca). Accordingly, lateral visibility may be improved by allowing the voltages charged in the first subpixel (PXa) and the second subpixels (PXa and PXb) in one pixel PX to be different from each other.

Figure 7:
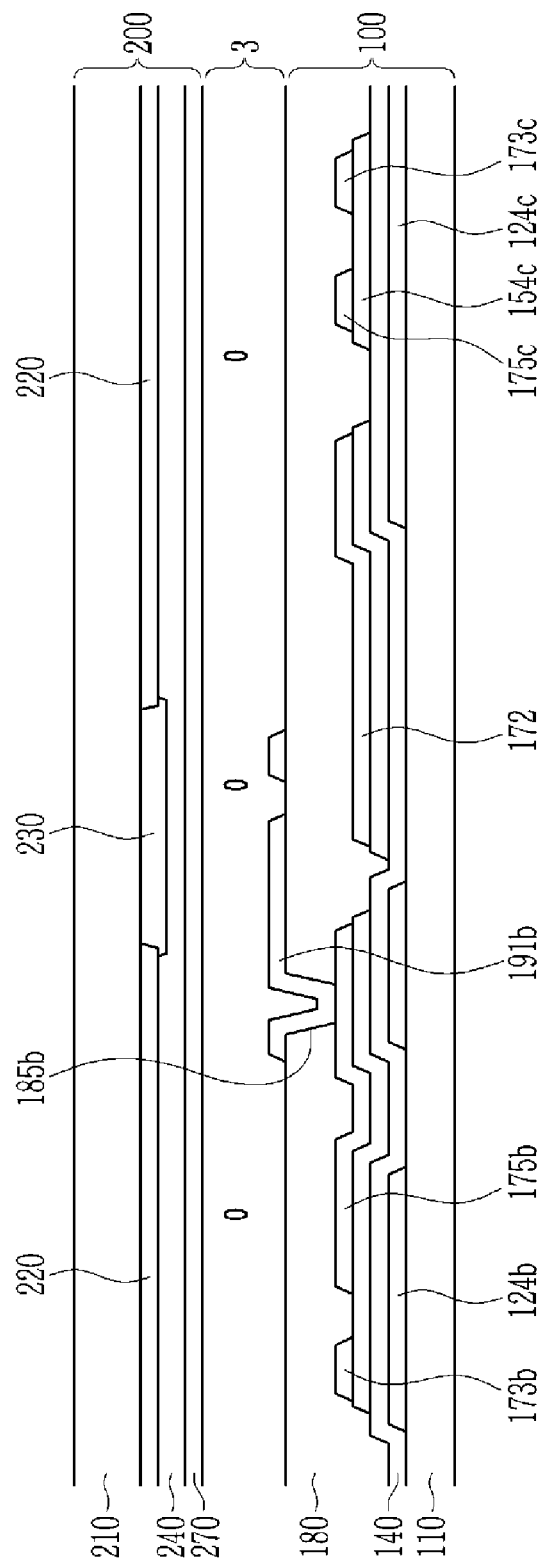
FIG. 7 shows a cross-sectional view taken along line VII-VII of FIG. 5.
Figure 8:
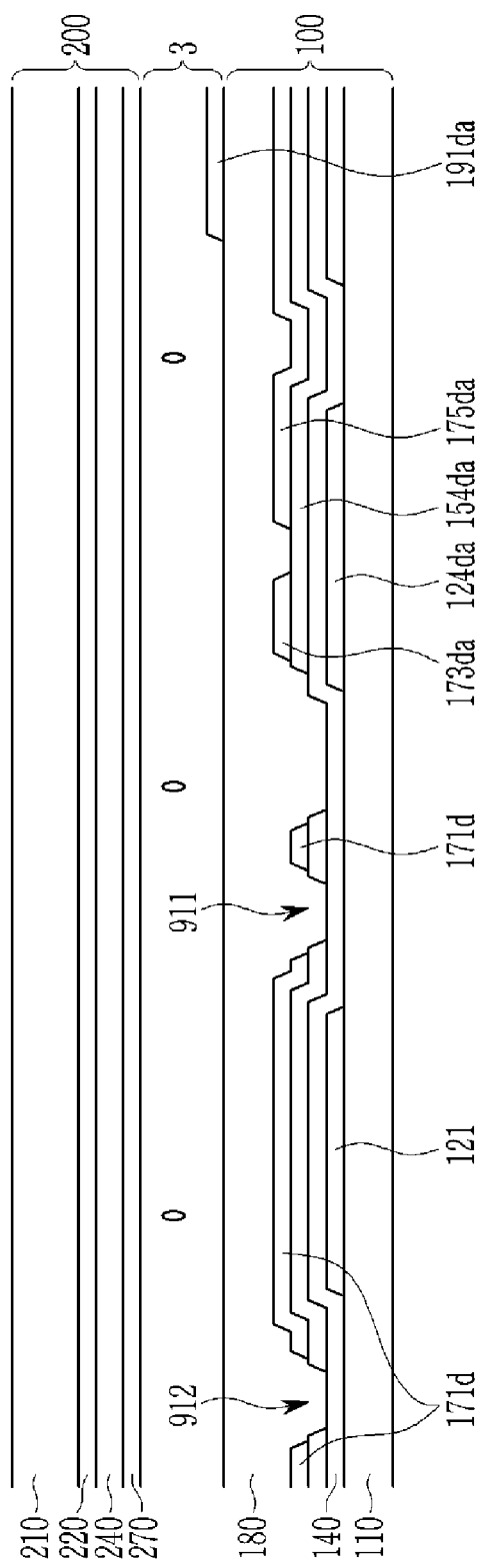
FIG. 8 shows a cross-sectional view taken along line VIII-VIII of FIG. 5.
Figure 9:
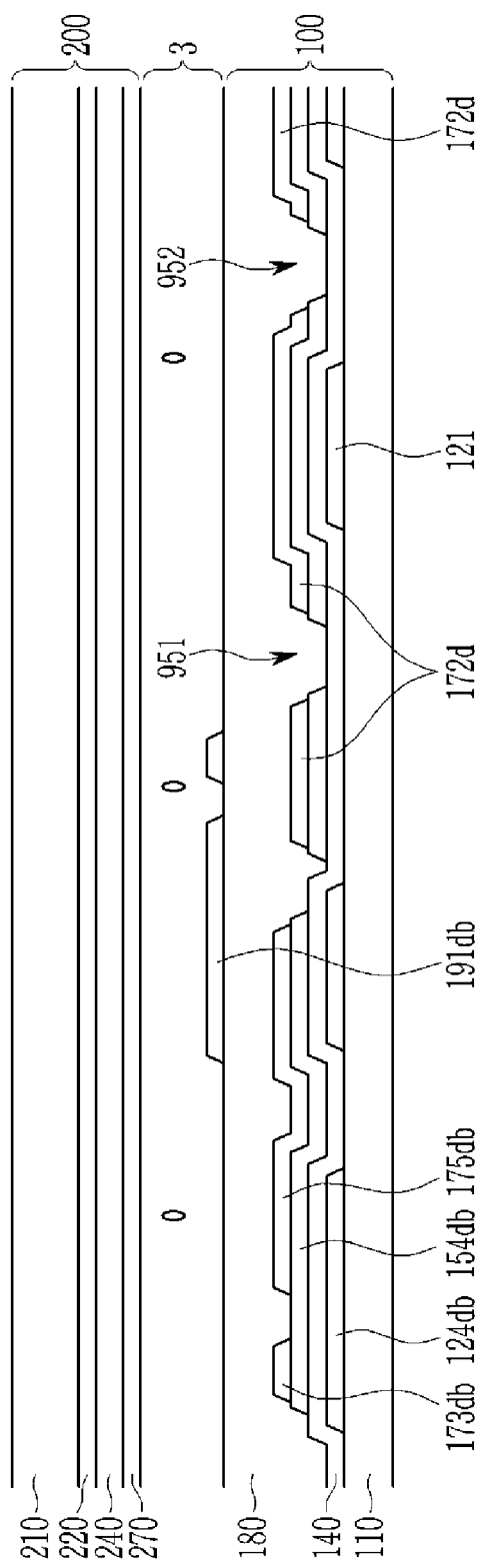
FIG. 9 shows a cross-sectional view taken along line IX-IX of FIG. 5.

A display device according to an example embodiment will now be described with reference to FIG. 5, FIG. 6, FIG. 7, FIG. 8 and, FIG. 9.

Figure 5:
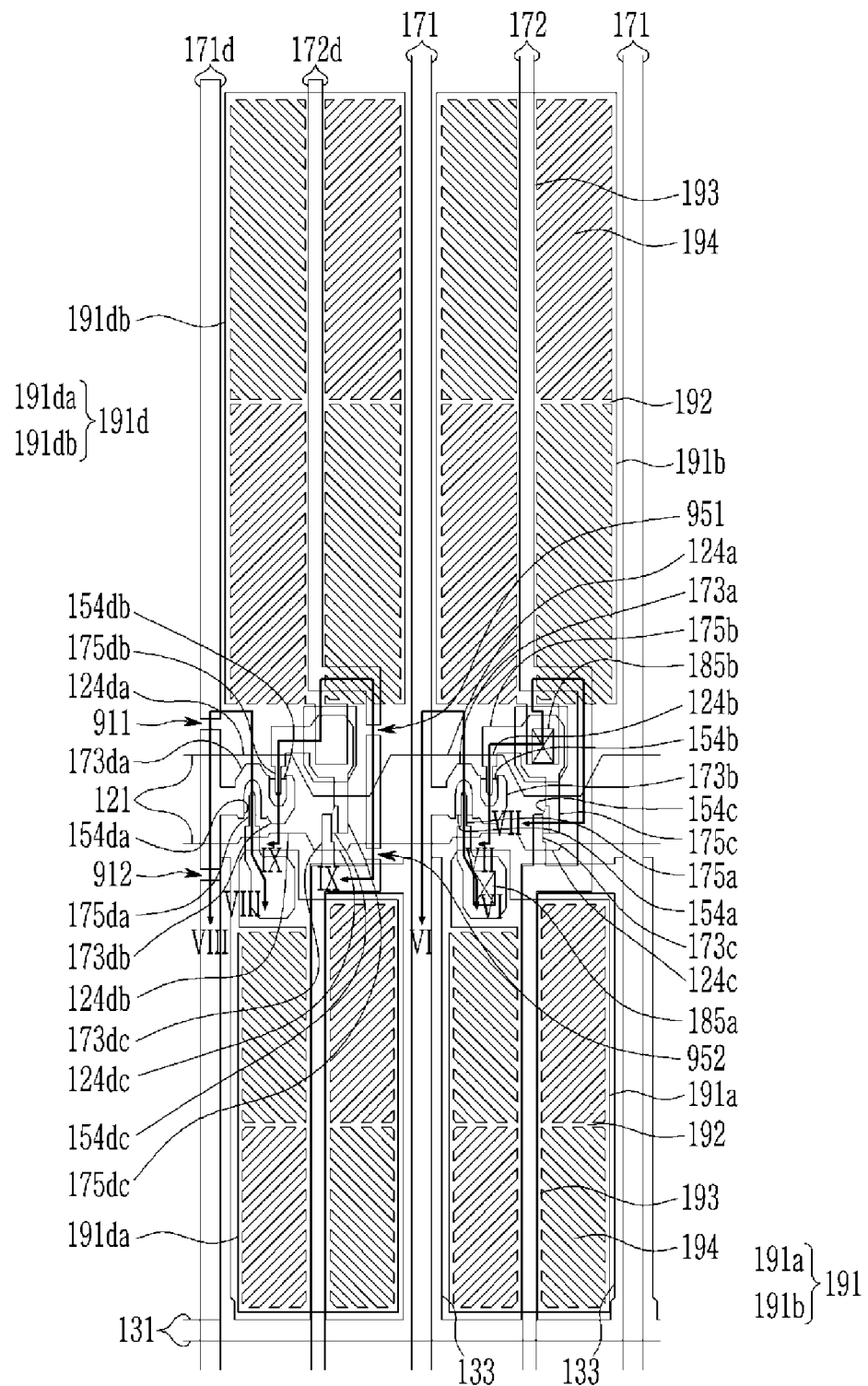
FIG. 5 shows a top plan view of a pixel shown in FIG. 4 and an adjacent dummy pixel.
Figure 6:
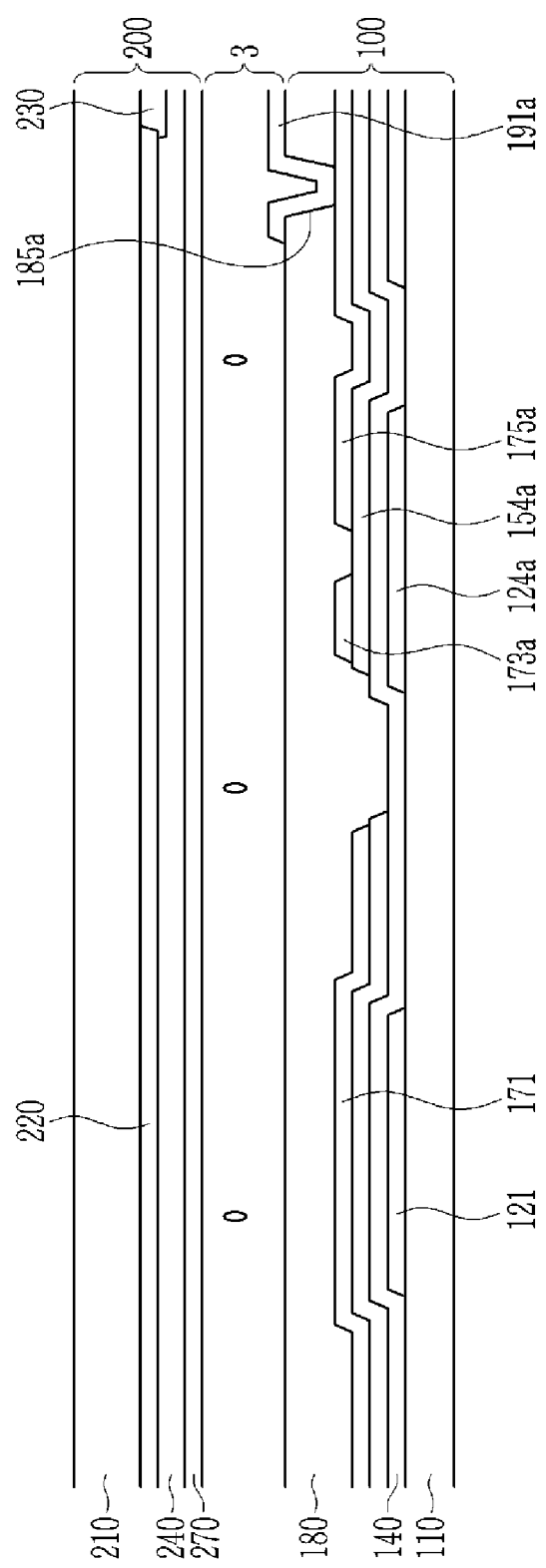
FIG. 6 shows a cross-sectional view taken along line VI-VI of FIG. 5.

FIG. 5 shows a top plan view of a pixel shown in FIG. 4 and an adjacent dummy pixel. The pixel shown in FIG. 5 may be a pixel in a top left corner of the display device, and the dummy pixel may be disposed on the left of the pixel. FIG. 6 shows a cross-sectional view taken along line VI-VI of FIG. 5, and FIG. 7 shows a cross-sectional taken along line VII-VII of FIG. 5. FIG. 8 shows a cross-sectional view taken along line VIII-VIII of FIG. 5, and FIG. 9 shows a cross-sectional taken along line IX-IX of FIG. 5.

The thin film transistor array panel 100 will now be described.

A gate line 121 and a storage electrode line 131 extending in a horizontal direction may be disposed on a first substrate 110.

The gate line 121 may mainly extend in the row direction and may transmit a gate signal (Vg). A first gate electrode 124a and a second gate electrode 124b integrally formed with the gate line 121 and connected to each other may be disposed on the first substrate 110. Further, a third gate electrode 124c integrally formed with the gate line 121 and disposed near the first gate electrode 124a and the second gate electrode 124b may be disposed on the first substrate 110. The first, second, and third gate electrodes 124a, 124b, and 124c connected to the same gate line 121, and the same gate signal may be applied to the first, second, and third gates lines 124a, 124b, and 124c.

The storage electrode line 131 extends substantially parallel to the gate line 121, and a predetermined storage voltage may be applied to the storage electrode line 131. A storage electrode 133 protruding from the storage electrode line 131 may be disposed on the first substrate 110. The storage electrode 133 may have a form protruding upward from the storage electrode line 131 in a plan view. The storage electrode 133 may surround the edge of a first sub-pixel electrode 191a, and may overlap a reference voltage line 172.

A first dummy gate electrode 124d a and a second dummy gate electrode 124db integrally formed with the gate line 121 and connected to each other are disposed on the first substrate 110. A third dummy gate electrode 124dc integrally formed with the gate line 121 and disposed near the first dummy gate electrode 124da and the second dummy gate electrode 124db may be disposed on the first substrate 110.

The gate line 121, the first, second, and third gate electrodes 124a, 124b, and 124c, the storage electrode line 131, the storage electrode 133, the first dummy gate electrode 124da, the second dummy gate electrode 124db, and the third dummy gate electrode 124dc may be formed in the same process, and they may be disposed on the same layer, which is referred to as a gate conductor. A gate insulating layer 140 may be disposed on the gate conductor. The gate insulating layer 140 may be formed of an inorganic insulating material such as a silicon nitride (SiNx) or a silicon oxide (SiOx). The gate insulating layer 140 may be made of a monolayer or a multilayer.

A first semiconductor 154a, a second semiconductor 154b, and a third semiconductor 154c may be disposed on the gate insulating layer 140. The first semiconductor 154a, the second semiconductor 154b, and the third semiconductor 154c may be made of amorphous silicon, polysilicon, and an oxide semiconductor material. The first semiconductor 154a may overlap the first gate electrode 124a, the second semiconductor 154b may overlap the second gate electrode 124b, and the third semiconductor 154c may overlap the third gate electrode 124c.

A first dummy semiconductor 154da, a second dummy semiconductor 154db, and a third dummy semiconductor 154dc may be disposed on the gate insulating layer 140. The first dummy semiconductor 154da may overlap the first dummy gate electrode 124da, the second dummy semiconductor 154db may overlap the second dummy gate electrode 124db, and the third dummy semiconductor 154dc may overlap the third dummy gate electrode 124dc.

A data line 171, a reference voltage line 172, a first source electrode 173a, a first drain electrode 175a, a second source electrode 173b, a second drain electrode 175b, a third source electrode 173c, and a third drain electrode 175c may be disposed on the first, second, and third semiconductors 154a, 154b, and 154c, and the gate insulating layer 140.

The first to third semiconductors 154a, 154b, and 154c may be above the first, second, third gate electrodes 124a, 124b, and 124c and below the data line 171. The second semiconductor 154b may be connected to the third semiconductor 154c. The present example embodiment is, however, not limited, and the first, second, and third semiconductors 154a, 154b, and 154c may be disposed on the first, second, and third gate electrodes 124a, 124b, and 124c, and the second semiconductor 154b may be separated from the third semiconductor 154c.

The data line 171 and the reference voltage line 172 extend in a vertical direction. The vertical direction crosses the horizontal direction, and for example, it may be substantially perpendicular to the horizontal direction.

The data line 171 may mainly extend in the column direction, it may cross the gate line 121, and it may transmit the data voltage (Vd).

The reference voltage line 172 extends substantially parallel to the data line 171, and a predetermined reference voltage may be applied to the reference voltage line 172. The reference voltage line 172 may be disposed between two adjacent data lines 171. The reference voltage line 172 may overlap the pixel electrode 191, and particularly, it may be disposed in a center of the pixel electrode 191 and may extend in the column direction. The reference voltage line 172 may detour so that it may not overlap the third switching element disposed between the first sub-pixel electrode 191a and the second sub-pixel electrode 191b. The reference voltage line 172 may overlap the storage electrode 133. The reference voltage applied to the reference voltage line 172 may be substantially equivalent to the storage voltage applied to the storage electrode 133.

The first source electrode 173a may protrude from the data line 171, and it may overlap the first gate electrode 124a. The first source electrode 173a may be bent in an U-shape around the first gate electrode 124a.

The first drain electrode 175a may be separated from the first source electrode 173a on the first gate electrode 124a. A channel is formed on the first semiconductor 154a at an exposed portion between the first source electrode 173a and the first drain electrode 175a.

The second source electrode 173b extends from the first source electrode 173a, and it may overlap the second gate electrode 124b. The second source electrode 173b may be bent in an U-shape around the second gate electrode 124b.

The second drain electrode 175b may be separated from the second source electrode 173b on the second gate electrode 124b. A channel is formed on the second semiconductor 154b at an exposed portion between the second source electrode 173b and the second drain electrode 175b.

The third source electrode 173c may protrude from the reference voltage line 172, and it may overlap the third gate electrode 124c.

The third drain electrode 175c may be connected to the second drain electrode 175b, and it may overlap the third gate electrode 124c. The third drain electrode 175c may be separated from the third source electrode 173c on the third gate electrode 124c. A channel is formed on the third semiconductor 154c at an exposed portion between the third source electrode 173c and the third drain electrode 175c.

The above-described first gate electrode 124a, the first semiconductor 154a, the first source electrode 173a, and the first drain electrode 175a comprise a first switching element T1. The second gate electrode 124b, the second semiconductor 154b, the second source electrode 173b, and the second drain electrode 175b comprise a second switching element T2, and the third gate electrode 124c, the third semiconductor 154c, the third source electrode 173c, and the third drain electrode 175c comprise a third switching element T3.

A dummy data line 171d, a dummy reference voltage line 172d, a first dummy source electrode 173da, a first dummy drain electrode 175da, a second dummy source electrode 173db, a second dummy drain electrode 175db, a third dummy source electrode 173dc, and a third dummy drain electrode 175dc may be disposed on the first to third dummy semiconductors 154da, 154db, and 154dc and the gate insulating layer 140.

The first, second, and third dummy semiconductors 154da, 154db, and 154dc may be above the first, second, third dummy gate electrodes 124da, 124db, and 124dc and below the dummy data line 171d. The second dummy semiconductor 154db may be connected to the third dummy semiconductor 154dc. The present example embodiment is, however, not limited, and the first, second, and third dummy semiconductors 154da, 154db, and 154dc may be disposed on the first, second, and third dummy gate electrodes 124da, 124db, and 124dc, and the second dummy semiconductor 154db may be separated from the third dummy semiconductor 154dc.

The dummy data line 171d and the dummy reference voltage line 172d may extend substantially parallel to the data line 171 and the reference voltage line 172.

The dummy data line 171d is near the data line 171, it mainly extends in the column direction, and it may cross the gate line 121. The dummy data line 171d floats, and no signal is applied to the dummy data line 171d.

The dummy data line 171d includes openings 911 and 912 disposed on a portion that is near an overlapping portion with the gate line 121. The openings 911 and 912 of the dummy data line 171d may include an upper opening 911 disposed on an upper side of the overlapping portion with the gate line 121 and a lower opening 912 disposed on a lower side of the overlapping portion with the gate line 121 in a plan view. Portions of the dummy data line 171d are separated by the openings 911 and 912. For example, a portion of the dummy data line 171d in the upper side of the upper opening 911 is separated from a portion of the dummy data line 171d in the lower side of the upper opening 911. In addition, a portion of the dummy data line 171d in the upper side of the lower opening 912 is separated from a portion of the dummy data line 171d in the lower side of the lower opening 912. Hence, the portions of the dummy data line 171d separated by the openings 911 and 912 are electrically insulated from each other.

The openings 911 and 912 of the dummy data line 171d are disposed on the upper side and the lower side of the overlapping portion with the gate line 121, so a number of the openings 911 and 912 of the dummy data line 171d may be greater than a number of gate lines 121. For example, the number of the openings 911 and 912 of the dummy data line 171d may be about twice the number of the gate lines 121. This is, however, an example, and the present example embodiment is not limited. The openings 911 and 912 of the dummy data line 171d may not be near the overlapping portion of the entire gate lines 121, but the openings 911 and 912 of the dummy data line 171d may be near the overlapping portion of some gate lines 121. Accordingly, the number of the openings 911 and 912 of the dummy data line 171d is modifiable in many ways.

The dummy reference voltage line 172d is near the data line 171, it generally extends in the column direction, and it may cross the gate line 121. The dummy reference voltage line 172d may be disposed between the data line 171 and the dummy data line 171d. The dummy reference voltage line 172d floats, and no signal is applied to the dummy reference voltage line 172d. The dummy reference voltage line 172d may overlap the dummy pixel electrode 191d, and particularly, it may be disposed in the center of the dummy pixel electrode 191d and may extend in the column direction.

The dummy reference voltage line 172d includes openings 951 and 952 that are near the overlapping portion with the gate line 121. The openings 951 and 952 of the dummy reference voltage line 172d may include an upper opening 951 in the upper side of the overlapping portion with the gate line 121 and a lower opening 952 in the lower side of the overlapping portion with the gate line 121 in a plan view. Portions of the dummy reference voltage line 172d are separated by the openings 951 and 952. For example, a portion of the dummy reference voltage line 172d in the upper side of the upper opening 951 is separated from a portion of the dummy reference voltage line 172d in the lower side of the upper opening 951. A portion of the dummy reference voltage line 172d in the upper side of the lower opening 952 is separated from a portion of the dummy reference voltage line 172d in the lower side of the lower opening 952. Therefore, the portions of the dummy reference voltage line 172d separated by the openings 951 and 952 are electrically insulated from each other.

As the openings 951 and 952 of the dummy reference voltage line 172d are in the upper side and the lower side of the overlapping portion with the gate line 121, the number of the openings 951 and 952 of the dummy reference voltage line 172d may be greater than the number of the gate lines 121. For example, the number of the openings 951 and 952 of the dummy reference voltage line 172d may be about twice the number of the gate lines 121. This is, however, an example, and the present example embodiment is not limited. The openings 951 and 952 of the dummy reference voltage line 172d may not be near the overlapping portion of all gate lines 121, and they may be near the overlapping portion with some gate lines 121. Accordingly, the number of the openings 951 and 952 of the dummy reference voltage line 172d is variable in many ways.

The first dummy source electrode 173da protrudes from the dummy data line 171d, and it may overlap the first dummy gate electrode 124da. The first dummy source electrode 173da may be bent in an U-shape around the first dummy gate electrode 124da.

The first dummy drain electrode 175da may be separated from the first dummy source electrode 173da on the first dummy gate electrode 124da.

The second dummy source electrode 173db extends from the first dummy source electrode 173da, and it may overlap the second dummy gate electrode 124db. The second dummy source electrode 173db may be bent in an U-shape around the second dummy gate electrode 124db.

The second dummy drain electrode 175db may be separated from the second dummy source electrode 173db on the second dummy gate electrode 124db.

The third dummy source electrode 173dc protrudes from the dummy reference voltage line 172d, and it may overlap the third dummy gate electrode 124dc.

The third dummy drain electrode 175dc is connected to the second dummy drain electrode 175db, and it may overlap the third dummy gate electrode 124dc. The third dummy drain electrode 175dc may be separated from the third dummy source electrode 173dc on the third dummy gate electrode 124dc.

The dummy data line 171*d*, the dummy reference voltage line 172*d*, the first, second, and third dummy source electrodes 173*da*, 173*db*, and 173*dc*, and the first, second, and third dummy drain electrodes 175*da*, 175*db*, and 175*dc* may have similar planar shapes to the data line 171, the reference voltage line 172, the first, second, and third source electrodes 173*a*, 173*b*, and 173*c*, and the first, second, and third drain electrodes 175*a*, 175*b*, and 175*c*.

The data line 171, the reference voltage line 172, the first, second, and third source electrodes 173*a*, 173*b*, and 173*c*, the first, second, and third drain electrodes 175*a*, 175*b*, and 175*c*, the dummy data line 171*d*, the dummy reference voltage line 172*d*, the first, second, and third dummy source electrodes 173*da*, 173*db*, and 173*dc*, and the first, second, third dummy drain electrodes 175*da*, 175*db*, and 175*dc* may be formed in the same process, and they may be disposed on the same layer, which is referred to as a data conductor.

A gate insulating layer 140 is disposed between the gate conductor and the data conductor. For example, a gate insulating layer 140 is disposed between the gate line 121 and the data line 171. That is, the gate line 121 may overlap the data line 171 with the gate insulating layer 140 which is disposed between the gate line 121 and the data line 171. Further, the gate insulating layer 140 is disposed between the gate line 121 and the reference voltage line 172. That is, the gate line 121 may overlap the reference voltage line 172 with the gate insulating layer 140 which is disposed between the gate line 121 and the reference voltage line 172. In a like manner, a gate insulating layer 140 is disposed between the gate line 121 and the dummy data line 171*d*. That is, the gate line 121 may overlap the dummy data line 171*d* with the gate insulating layer 140 which is disposed between the gate line 121 and the dummy data line 171*d*. Further, the gate insulating layer 140 is disposed between the gate line 121 and the dummy reference voltage line 172*d*. That is, the gate line 121 may overlap the dummy reference voltage line 172*d* with the gate insulating layer 140 which is disposed between the gate line 121 and the dummy reference voltage line 172*d*.

Two metal layers with the insulating layer therebetween are insulated from each other. However, the two metal layers which have to be insulated from each other may be short-circuited by various reasons such as a case in which a thin insulating layer is deposited while the process is performed or a case in which the insulating layer is damaged in the process for etching a metal layer. It is easy in an earlier stage to detect a short-circuit between the gate line 121 and the data line 171 and a short-circuit between the gate line 121 and the reference voltage line 172 in the process performing stage. Compared to this, it is relatively not easy to detect a short-circuit between the gate line 121 and the dummy data line 171*d* and a short-circuit between the gate line 121 and the dummy reference voltage line 172*d*. The dummy pixel is covered by the light blocking member 220, so it is not easy to detect a short-circuit. When the above-noted defects are found after attachment of such as a polarizer or a printed circuit board (PCB), there may be a big loss when the product is discarded.

In the present example embodiment, the dummy data line 171*d* includes the openings 911 and 912, and the dummy reference voltage line 172*d* includes the openings 951 and 952, thereby preventing the gate signal applied to the gate line 121 from being varied when a short-circuit is generated. When there is no such opening, and a short-circuit is generated between the dummy data line 171*d* and the gate line 121 or between the dummy reference voltage line 172*d* and the gate line 121, a load is generated to the signal applied to the gate line 121, and the gate signal may be changed. In the present example embodiment, as the dummy data line 171*d* includes the openings 911 and 912 on a portion that is near the overlapping portion with the gate line 121, the load of the gate signal may be minimized and a variation width of a gate output waveform may be minimized when a short-circuit is generated between the dummy data line 171*d* and the gate line 121. Further, the dummy reference voltage line 172*d* includes the openings 951 and 952 on a portion that is near the overlapping portion with the gate line 121, so that the load of the gate signal may be minimized and a variation width of a gate output waveform may be minimized when a short-circuit is generated between the dummy reference voltage line 172*d* and the gate line 121.

A passivation layer 180 may be disposed on the data conductor. The passivation layer 180 may be made of an organic insulating material or an inorganic insulating material, and it may be a monolayer or a multilayer. In this instance, the organic insulating material may be a color filter.

The passivation layer 180 may include a first contact hole 185*a* overlapping the first drain electrode 175*a*. Further, the passivation layer 180 may include a second contact hole 185*b* overlapping the second drain electrode 175*b*.

A pixel electrode 191 and a dummy pixel electrode 191*d* may be disposed on the passivation layer 180. The pixel electrode 191 may include a first sub-pixel electrode 191*a* and a second sub-pixel electrode 191*b*. The dummy pixel electrode 191*d* may include a first dummy sub-pixel electrode 191*da* and a second dummy sub-pixel electrode 191*db*.

The first sub-pixel electrode 191*a* may be connected to the first drain electrode 175*a* through the first contact hole 185*a*, and the second sub-pixel electrode 191*b* may be connected to the second drain electrode 175*b* through the second contact hole 185*b*.

The first sub-pixel electrode 191*a* and the second sub-pixel electrode 191*b* may respectively receive a data voltage from the first drain electrode 175*a* and the second drain electrode 175*b*. In this instance, some of the data voltage applied to the second drain electrode 175*b* is divided by the third drain electrode 175*c*, so that a size of the voltage applied to the second sub-pixel electrode 191*b* becomes less than a size of the voltage applied to the first sub-pixel electrode 191*a*. This represents a case in which the positive-polarity (+) data voltage is applied to the first sub-pixel electrode 191*a* and the second sub-pixel electrode 191*b*, and when the negative polarity (−) data voltage is applied to the first sub-pixel electrode 191*a* and the second sub-pixel electrode 191*b*, the voltage applied to the first sub-pixel electrode 191*a* becomes less than the voltage applied to the second sub-pixel electrode 191*b*.

An area of the second sub-pixel electrode 191*b* may be about the same or about twice of an area of the first sub-pixel electrode 191*a*.

The first sub-pixel electrode 191*a* and the second sub-pixel electrode 191*b* may neighbor each other in the column direction, their overall shapes may substantially be quadrangles, and they may include a cross-shaped stem including a horizontal stem 192 and a vertical stem 193 crossing the same. Further, the first sub-pixel electrode 191*a* and the second sub-pixel electrode 191*b* are divided into four sub-regions by the horizontal stem 192 and the vertical stem 193, and a plurality of fine branches 194 may be disposed in each sub-region.

Some of the fine branches 194 of the first sub-pixel electrode 191*a* and the second sub-pixel electrode 191*b* obliquely extend in the top left direction from the horizontal stem 192 or the vertical stem 193, and other fine branches 194 obliquely extend in the top right direction from the horizontal stem 192 or the vertical stem 193. In addition, still other fine branches 194 extend in the bottom left direction from the horizontal stem 192 or the vertical stem 193, and the final fine branches 194 obliquely extend in the bottom right direction from the horizontal stem 192 or the vertical stem 193.

Each of the fine branches 194 may form an angle of about 40 to about 45 degrees with respect to the gate line 121 or the horizontal stem 192. Further, the fine branches 194 of the two neighboring sub-regions may be perpendicular to each other.

The first dummy sub-pixel electrode 191*da* may overlap the first dummy drain electrode 175*da*, and it is not connected to the first dummy drain electrode 175*da*. The second dummy sub-pixel electrode 191*db* may overlap the second dummy drain electrode 175*db*, and it is not connected to the second dummy drain electrode 175*db*. The dummy pixel electrode 191*d* floats, and no voltage is applied to the dummy pixel electrode 191*d*.

The dummy pixel electrode 191*d* may have a similar planar shape to the pixel electrode 191.

The opposite display panel 200 will now be described.

A light blocking member 220 may be disposed on a second substrate 210. The light blocking member 220 is also referred to as a black matrix, and it may prevent leakage of light. The light blocking member 220 may overlap the gate line 121 and the data line 171. In addition, the light blocking member 220 may overlap the dummy data line 171*d*, the dummy reference voltage line 172*d*, and the dummy pixel electrode 191*d*. That is, the dummy pixel does not display on a screen, so it is covered by the light blocking member 220.

A plurality of color filters 230 may be disposed on the second substrate 210 and the light blocking member 220. The color filters 230 mostly exist in the region surrounded by the light blocking member 220, and they may extend along the column of the pixel electrode 191. The each color filter 230 may display one of the three primary colors of red, green, and blue. However, without limiting to the three primary colors of red, green, and blue, they may display one of cyan, magenta, yellow, and white-based colors.

The light blocking member 220 and the color filters 230 have been described to be disposed on the second substrate 210, but the present example embodiment is not limited. At least one of the light blocking member 220 and the color filters 230 may be disposed on the first substrate 110.

An overcoat 240 may be disposed on the color filter 230 and the light blocking member 220.

A common electrode 270 may be disposed on the overcoat 240.

Polarizers (not shown) may be disposed on outside of the thin film transistor array panel 100 and the opposite display panel 200. Polarization axes of the two polarizers may be orthogonal, and at least one polarization axis may be parallel to the gate line 121. In the case of a reflective display device, one of the two polarizers may be omitted.

The pixel electrode 191 having received the data voltage generates an electric field together with the common electrode 270 of the opposite display panel 200 receiving the common voltage, to thereby determine the direction of liquid crystal molecules of the liquid crystal layer 3 between the electrodes 191 and 270. Polarization of light passing through the liquid crystal layer 3 changes according to the determined direction of the liquid crystal molecules.

The first and second sub-pixel electrodes 191*a* and 191*b* and the common electrode 270 configure liquid crystal capacitors (Clca and Clcb), and maintain the applied voltage after the thin film transistor is turned off. In this instance, the sides of the fine branches 194 distort the electric field to generate horizontal components that are perpendicular to the sides of the fine branches 194, and the inclined direction of the liquid crystal molecules is determined to be a direction that is determined by the horizontal components. Therefore, the liquid crystal molecules tend to be inclined in the direction perpendicular to the sides of the fine branches 194 in the earlier stage. However, the directions of the horizontal components of the electric field by the sides of the neighboring fine branches 194 are opposite and a gap between the fine branches 194 is small, so the liquid crystal molecules inclining in the opposite directions are inclined in parallel to the length direction of the fine branches 194.

In the present example embodiment, the fine branches 194 extend in four length directions, so that the liquid crystal molecules may be inclined in a total of four directions. By diversifying the directions in which the liquid crystal molecules are inclined as described above, a reference viewing angle of the display device may increase.

A display device according to an example embodiment will now be described with reference to FIG. 10.

The display device according to an example embodiment described with reference to FIG. 10 mostly corresponds to the display device according to an example embodiment described with references to FIG. 1, FIG. 2, FIG. 3, FIG. 4, FIG. 5, FIG. 6, FIG. 7, FIG. 8, and FIG. 9, so that no repeated portions will be described. In the present example embodiment, the dummy reference voltage line includes no openings, which is different from the above-described example embodiment and will now be described.

Figure 10:
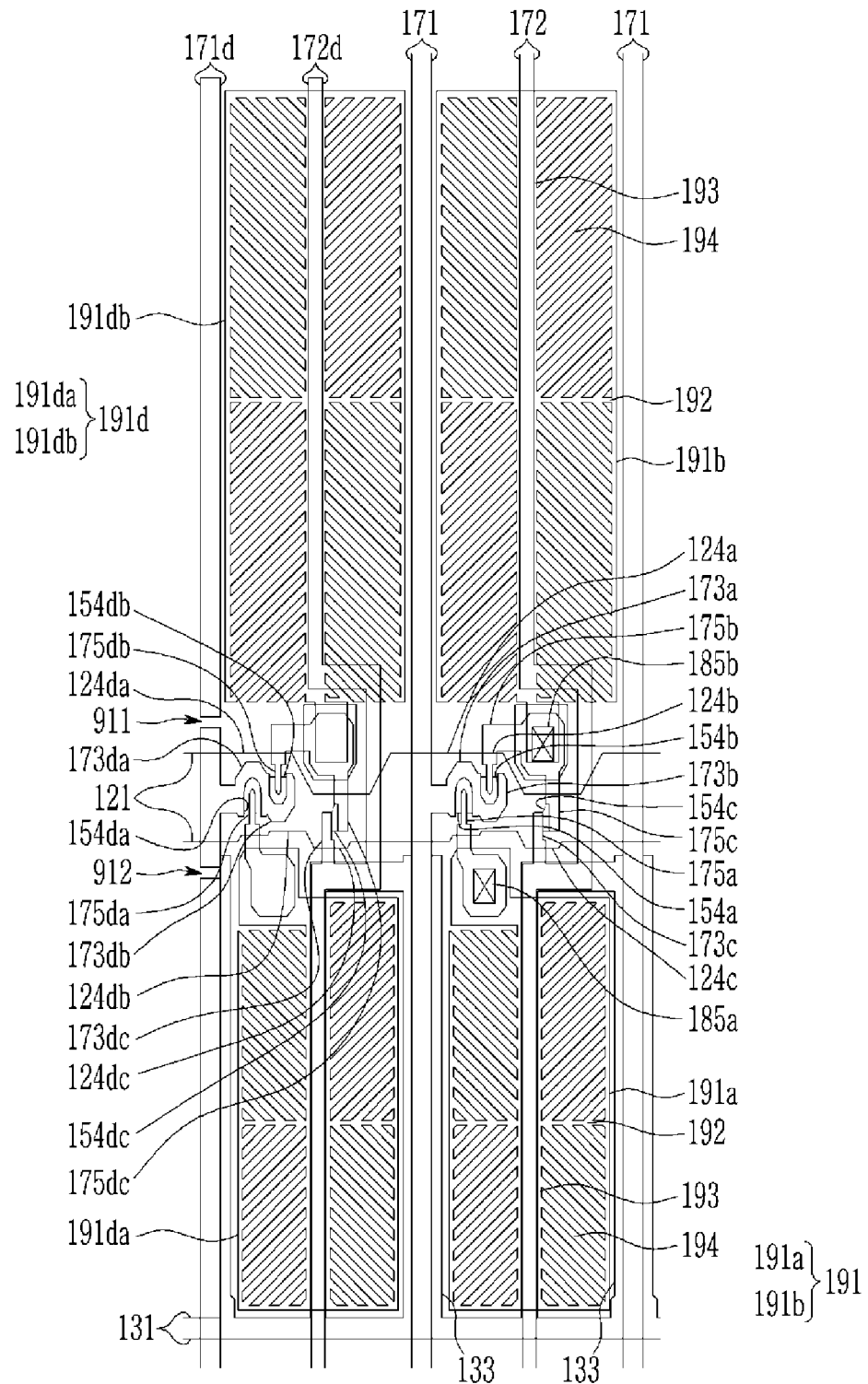
FIG. 10 shows a top plan view of a display device according to an example embodiment.

FIG. 10 shows a top plan view of a display device according to an example embodiment. FIG. 10 illustrates one pixel of a display device and a dummy pixel that is near the pixel.

The display device according to an example embodiment includes a gate line 121, a data line 171 crossing the gate line 121, and a dummy data line 171*d*. The display device may further include a reference voltage line 172 crossing the gate line 121, and a dummy reference voltage line 172*d*.

In the previous example embodiment, the dummy data line 171*d* includes openings 911 and 912, and the dummy reference voltage line 172*d* includes openings 951 and 952. In the present example embodiment, the dummy data line 171*d* includes openings 911 and 912, and the dummy reference voltage line 172*d* includes no openings.

The dummy data line 171*d* includes openings 911 and 912 that are near an overlapping portion with the gate line 121. The openings 911 and 912 of the dummy data line 171*d* may include an upper opening 911 that is disposed on the upper side of the overlapping portion with the gate line 121 and a lower opening 912 that is disposed on the lower side of the overlapping portion with the gate line 121 in a plan view. The portions of the dummy data line 171*d* that are on the respective sides of the openings 911 and 912 of the dummy data line 171*d* are electrically insulated from each other.

A display device according to an example embodiment will now be described with reference to FIG. 11.

The display device according to an example embodiment described with reference to FIG. 11 mostly corresponds to the display device according to an example embodiment described with references to FIG. 1, FIG. 2, FIG. 3, FIG. 4, FIG. 5, FIG. 6, FIG. 7, FIG. 8, and FIG. 9, so that no repeated portions will be described. The present example embodiment is different from the previous example embodiment in that the dummy data line includes no openings, which will now be described.

Figure 11:
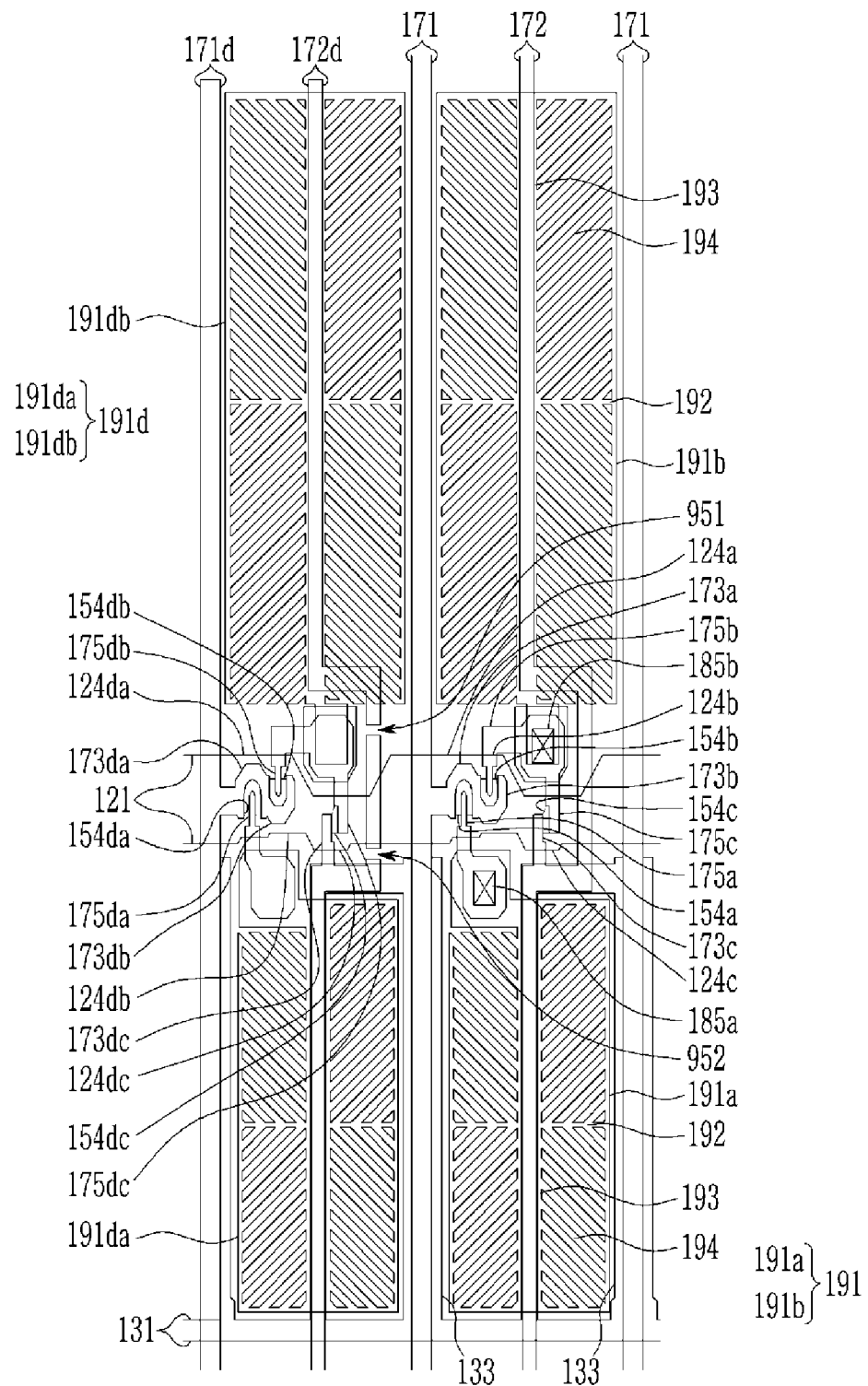
FIG. 11 shows a top plan view of a display device according to an example embodiment.

FIG. 11 shows a top plan view of a display device according to an example embodiment. FIG. 11 illustrates one pixel of a display device and a dummy pixel that is near the pixel.

The display device includes a gate line 121, a data line 171 crossing the gate line 121, and a dummy data line 171d. The display device may further include a reference voltage line 172 crossing the gate line 121, and a dummy reference voltage line 172d.

In a previous example embodiment, the dummy data line 171d includes openings 911 and 912, and the dummy reference voltage line 172d includes openings 951 and 952. In the present example embodiment, the dummy reference voltage line 172d includes openings 951 and 952, and the dummy data line 171d includes no openings.

The dummy reference voltage line 172d includes openings 951 and 952 that are on a portion that is near the overlapping portion with the gate line 121. The openings 951 and 952 of the dummy reference voltage line 172d may include an upper opening 951 that is disposed on the upper side of the overlapping portion with the gate line 121, and a lower opening 952 that is disposed on the lower side of the overlapping portion with the gate line 121 in a plan view. The portions of the dummy reference voltage line 172d separated by the openings 951 and 952 are electrically insulated from each other.

A display device according to an example embodiment will now be described with reference to FIG. 12.

The display device according to an example embodiment described with reference to FIG. 12 mostly corresponds to the display device according to an example embodiment described with references to FIG. 1, FIG. 2, FIG. 3, FIG. 4, FIG. 5, FIG. 6, FIG. 7, FIG. 8, and FIG. 9, so that no repeated portions will be described. The present example embodiment is different from the previous example embodiment in that the dummy data line and the dummy reference voltage line include no lower opening, which will now be described.

Figure 12:
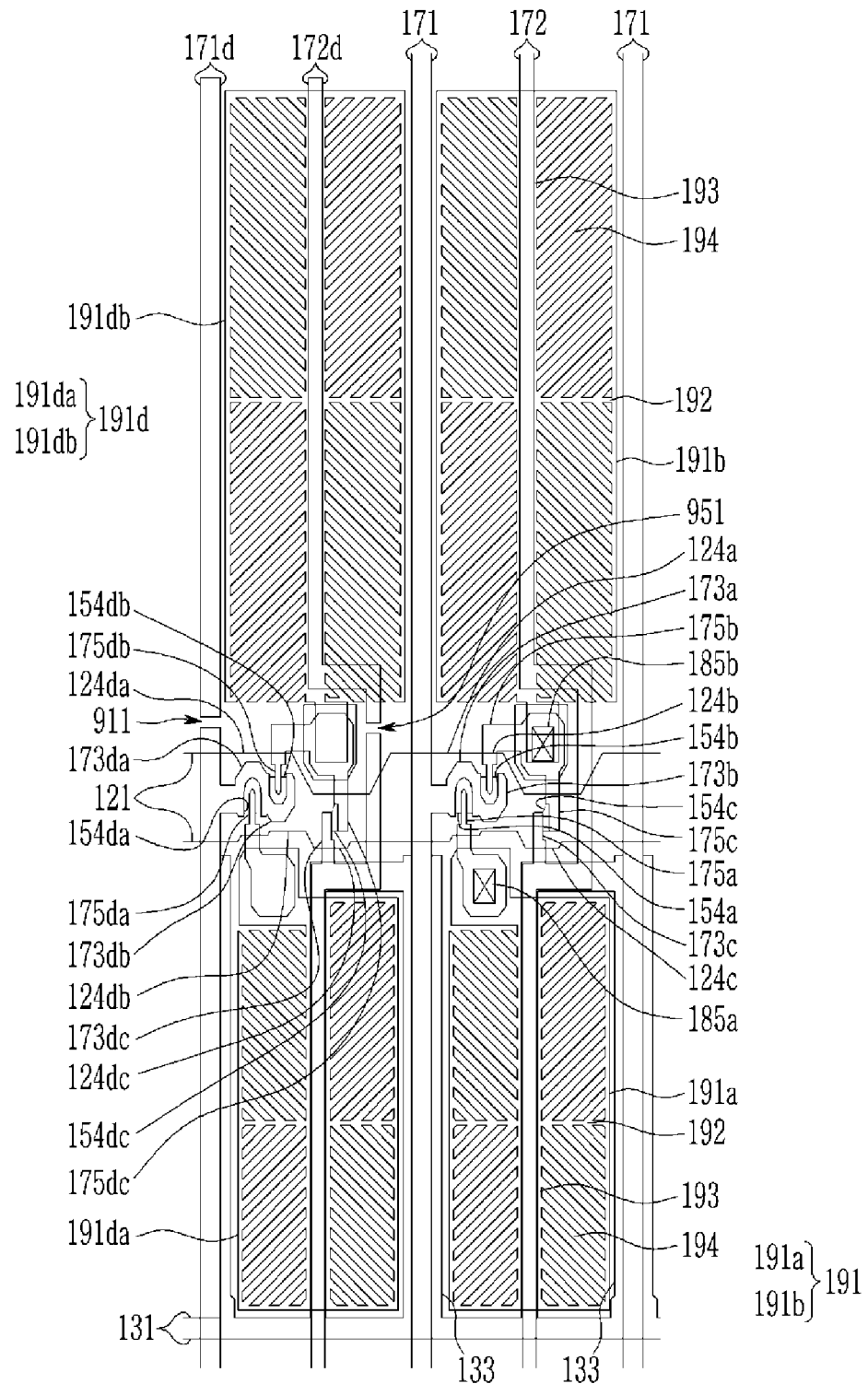
FIG. 12 shows a top plan view of a display device according to an example embodiment.

FIG. 12 shows a top plan view of a display device according to an example embodiment. FIG. 12 illustrates one pixel of a display device and a dummy pixel that is near the pixel.

The display device includes a gate line 121, a data line 171 crossing the gate line 121, and a dummy data line 171d. The display device may further include a reference voltage line 172 crossing the gate line 121, and a dummy reference voltage line 172d.

In a previous example embodiment, the dummy data line 171d includes an upper opening 911 and a lower opening 912, and the dummy reference voltage line 172d includes an upper opening 951 and a lower opening 952. However, in the present example embodiment, the dummy data line 171d includes an upper opening 911, and the dummy reference voltage line 172d includes an upper opening 951. The dummy data line 171d includes no lower opening, and the dummy reference voltage line 172d includes no lower opening.

The portions of the dummy data line 171d separated by the upper opening 911 are electrically insulated from each other. The portions of the dummy reference voltage line 172d separated by the upper opening 951 of the dummy reference voltage line 172d are electrically insulated from each other.

A display device according to an example embodiment will now be described with reference to FIG. 13.

The display device according to an example embodiment described with reference to FIG. 13 mostly corresponds to the display device according to an example embodiment described with references to FIG. 1, FIG. 2, FIG. 3, FIG. 4, FIG. 5, FIG. 6, FIG. 7, FIG. 8, and FIG. 9, so that no repeated portions will be described. The present example embodiment is different from the previous example embodiment in that the dummy data line and the dummy reference voltage line include no upper opening, which will now be described.

Figure 13:
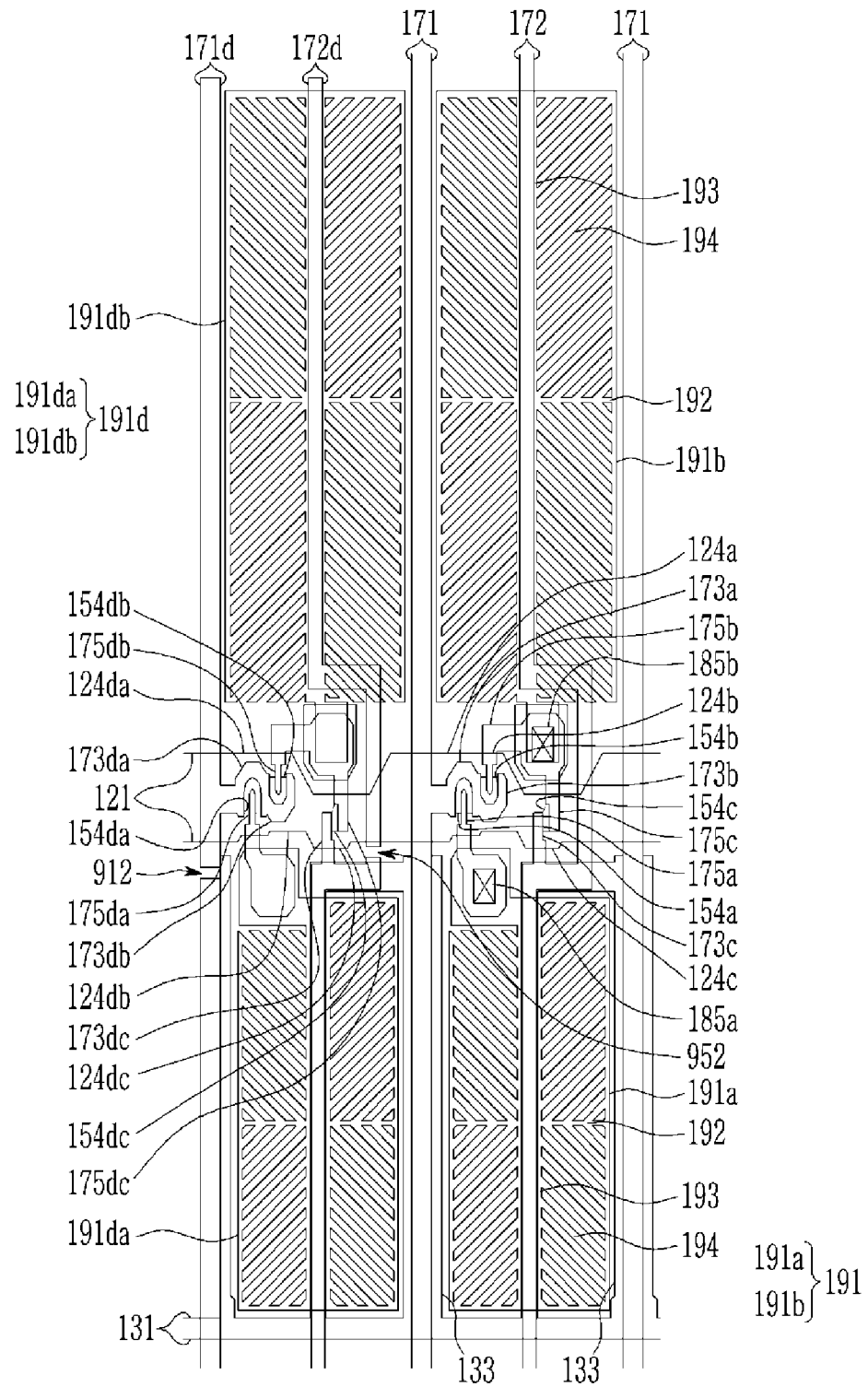
FIG. 13 shows a top plan view of a display device according to an example embodiment.

FIG. 13 shows a top plan view of a display device according to an example embodiment. FIG. 13 illustrates one pixel of a display device and a dummy pixel that is near the pixel.

The display device includes a gate line 121, a data line 171 crossing the gate line 121, and a dummy data line 171d. The display device may further include a reference voltage line 172 crossing the gate line 121, and a dummy reference voltage line 172d.

In a previous example embodiment, the dummy data line 171d includes an upper opening 911 and a lower opening 912, and the dummy reference voltage line 172d includes an upper opening 951 and a lower opening 952. In the present example embodiment, the dummy data line 171d includes a lower opening 912, and the dummy reference voltage line 172d includes a lower opening 952. The dummy data line 171d includes no upper openings, and the dummy reference voltage line 172d includes upper openings.

The portions of the dummy data line 171d separated by the lower opening 912 of the dummy data line 171d are electrically insulated from each other. The portions of the dummy reference voltage line 172d separated by the lower opening 952 of the dummy reference voltage line 172d are electrically insulated from each other.

A display device according to an example embodiment will now be described with references to FIG. 14, FIG. 15, and FIG. 16.

The display device according to an example embodiment described with reference to FIG. 14, FIG. 15, and FIG. 16 mostly corresponds to the display device according to an example embodiment described with references to FIG. 1, FIG. 2, FIG. 3, FIG. 4, FIG. 5, FIG. 6, FIG. 7, FIG. 8, and FIG. 9, so that no repeated portions will be described. The present example embodiment is different from the previous example embodiment in that the data line includes a first data line and a second data line.

Figure 14:
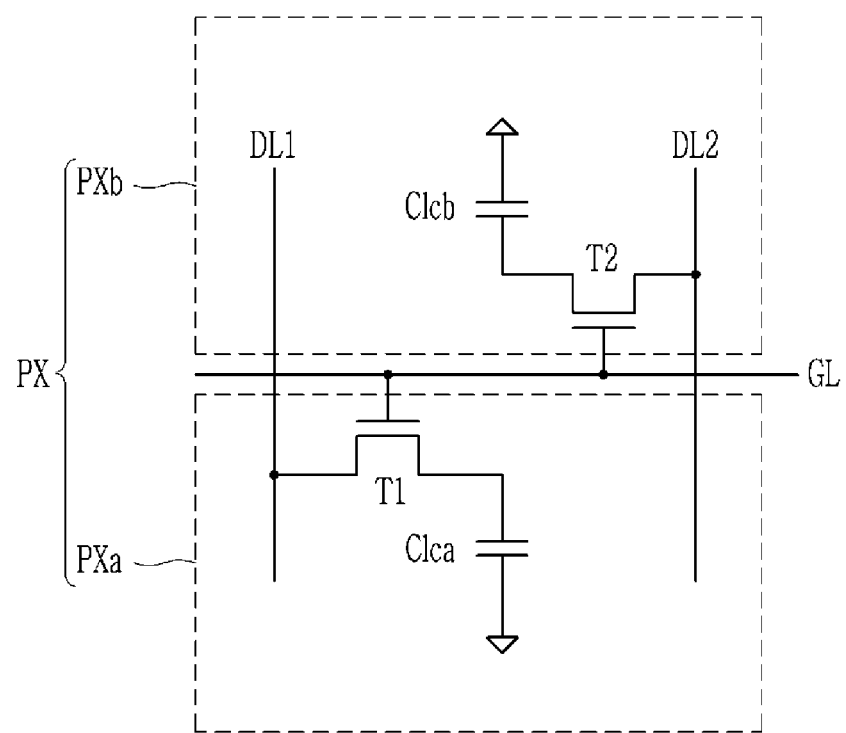
FIG. 14 shows an equivalent circuit diagram of a pixel of a display device according to an example embodiment.
Figure 15:
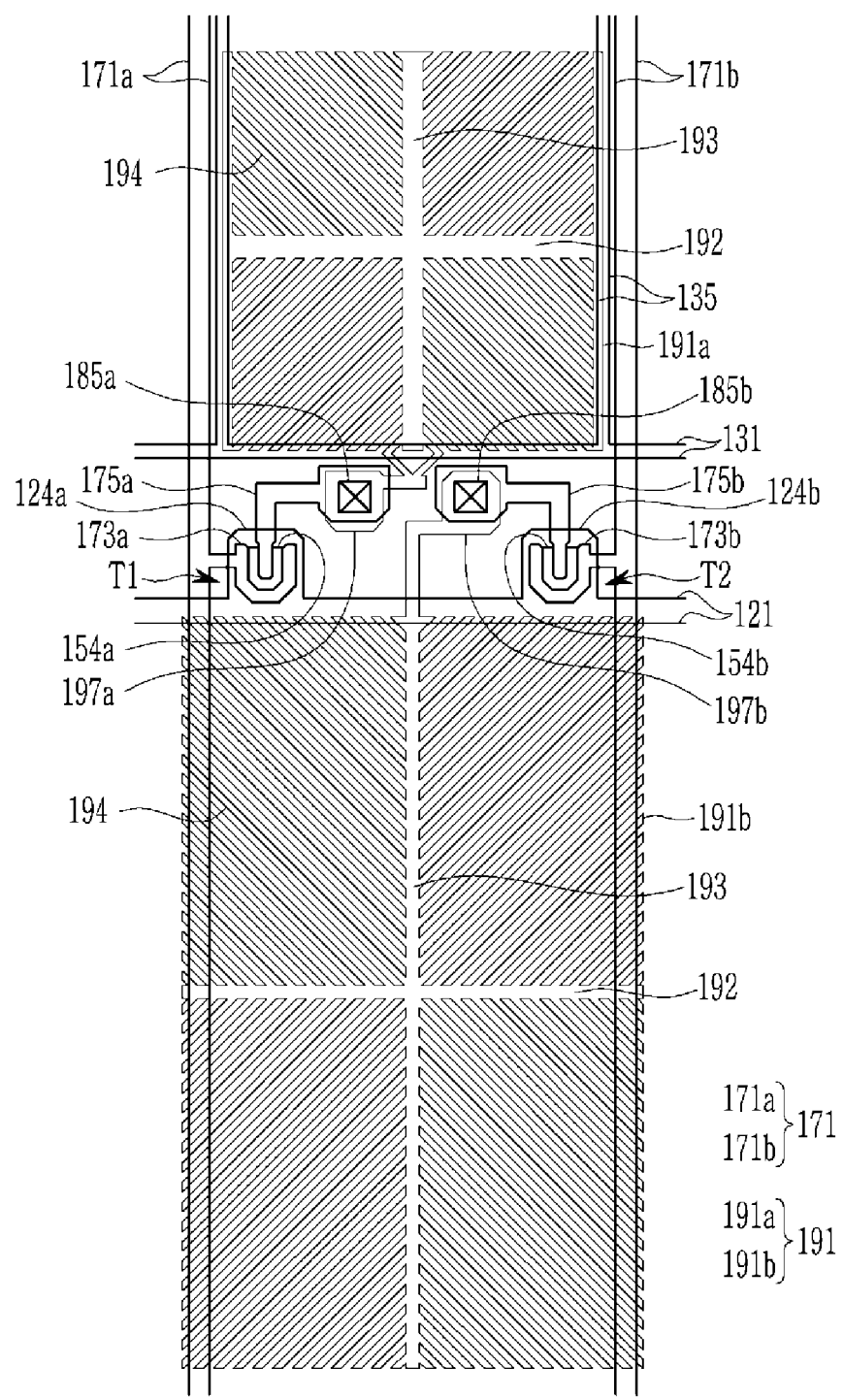
FIG. 15 shows a top plan view of a pixel shown in FIG. 14.
Figure 16:
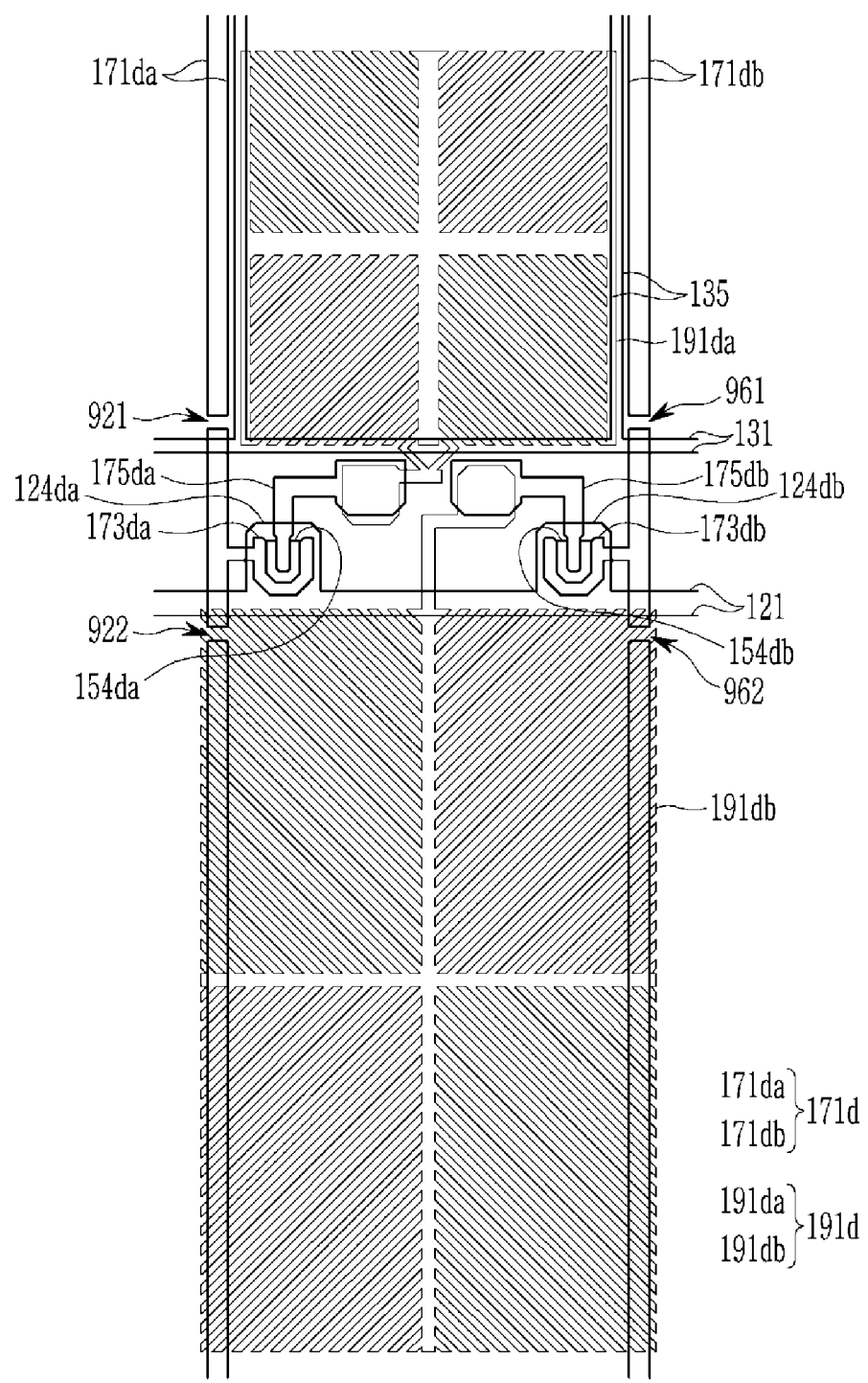
FIG. 16 shows a top plan view of a dummy pixel of a display device according to an example embodiment.

FIG. 14 shows an equivalent circuit diagram on a pixel of a display device according to an example embodiment, FIG. 15 shows a top plan view of a pixel shown in FIG. 14, and FIG. 16 shows a top plan view of a dummy pixel of a display device according to an example embodiment.

The display device includes a plurality of signal lines GL, DL1, and DL2 and a plurality of pixels PX connected to the plurality of the signal lines GL, DL1, and DL2.

The signal lines GL, DL1, and DL2 include a gate line GL for transmitting a gate signal, a first data line DL1 for transmitting a first data voltage, and a second data line DL2 for transmitting a second data voltage.

A first switching element T1 connected to the gate line GL and the first data line DL1 is disposed, and a second switching element T2 connected to the gate line GL and the second data line DL2 is disposed. The first switching element T1 and the second switching element T2 are connected to the gate line GL.

A first liquid crystal capacitor (Clca) connected to the first switching element T1 is formed on the first subpixel (PXa), and a second liquid crystal capacitor (Clcb) connected to the second switching element T2 is formed on the second subpixel (PXb).

The first switching element T1 includes a first terminal connected to the gate line GL, a second terminal connected to the first data line DL1, and a third terminal connected to the first liquid crystal capacitor Clca.

The second switching element T2 includes a first terminal connected to the gate line GL, a second terminal connected to the second data line DL2, and a third terminal connected to the second liquid crystal capacitor Clcb.

Regarding an operation of the display device according to an example embodiment, when a gate-on voltage is applied to the gate line (GL), the first switching element T1 and the second switching element T2 connected to the gate line (GL) are turned on. Different voltages are applied to the first data line DL1 and the second data line DL2, and the first liquid crystal capacitor Clca and the second liquid crystal capacitor Clcb are charged with different voltages. Therefore, lateral visibility may be improved by charging different voltages in the first subpixel PXa and the second subpixel PXb in one pixel PX.

A configuration of one pixel of a display device according to an example embodiment will now be described with reference to FIG. 15.

A gate line 121 and a storage electrode line 131 extending in the first direction may be disposed on a first substrate (not shown). A first gate electrode 124a and a second gate electrode 124b protruding from the gate line 121 are formed. A storage electrode 135 protruding from the storage electrode line 131 is formed. The storage electrode line 131 and the storage electrode 135 may function as a shield electrode in the configuration using an organic film on the lower portion of the pixel electrode 191.

Shapes and disposals of the storage electrode line 131 and the storage electrode 135 are modifiable in various ways.

Although not shown, a gate insulating layer may be disposed on the gate line 121, the first gate electrode 124a, the second gate electrode 124b, the storage electrode line 131, and the storage electrode 135.

A first semiconductor 154a and a second semiconductor 154b may be disposed on the gate insulating layer. The first semiconductor 154a may overlap the first gate electrode 124a, and the second semiconductor 154b may overlap the second gate electrode 124b.

A first data line 171a and a second data line 171b extending in the second direction may be disposed on the gate insulating layer. The second direction represents a direction that crosses the first direction, and for example, it may be the direction that is perpendicular to the first direction.

A pixel is disposed on a first substrate (not shown) in a matrix form. That is, a plurality of pixel columns and a plurality of pixel rows may be formed. The first data line 171a may be disposed on a left edge of each pixel column, and the second data line 171b may be disposed on a right edge of each pixel column.

A first source electrode 173a protruding from the first data line 171a and a first drain electrode 175a that is separated from the first source electrode 173a may be disposed on the gate insulating layer. The first source electrode 173a and the first drain electrode 175a may overlap the first gate electrode 124a. Further, a second source electrode 173b protruding from the second data line 171b and a second drain electrode 175b that is separated from the second source electrode 173b may be disposed on the gate insulating layer. The second source electrode 173b and the second drain electrode 175b may overlap the second gate electrode 124b.

The first gate electrode 124a, the first semiconductor 154a, the first source electrode 173a, and the first drain electrode 175a configure a first switching element T1. The second gate electrode 124b, the second semiconductor 154b, the second source electrode 173b, and the second drain electrode 175b configure a second switching element T2. Channels of the first and second switching elements T1 and T2 may be formed on the first and second semiconductors 154a and 154b between the first and second source electrodes 173a and 173b and the first and second drain electrodes 175a and 175b.

Although not shown, a passivation layer may be disposed on the first and second data lines 171a and 171b respectively and the first and second switching elements T1 and T2 respectively. The passivation layer may include a first contact hole 185a overlapping the first drain electrode 175a, and may include a second contact hole 185b overlapping the second drain electrode 175b.

A pixel electrode 191 may be disposed on the passivation layer. The pixel electrode 191 may include a first sub-pixel electrode 191a and a second sub-pixel electrode 191b. The first sub-pixel electrode 191a may be connected to the first drain electrode 175a through the first contact hole 185a, and the second sub-pixel electrode 191b may be connected to the second drain electrode 175b through the second contact hole 185b. The first sub-pixel electrode 191a may be connected to the first switching element T1, and the second sub-pixel electrode 191b may be connected to the second switching element T2. The first sub-pixel electrode 191a and the second sub-pixel electrode 191b may be disposed in one pixel, and they may be separated from each other with the gate line 121 which is disposed between the first sub-pixel electrode 191a and the second sub-pixel electrode 191b. The first and second sub-pixel electrodes 191a and 191b may be made of a transparent conductive material such as an ITO or an IZO, or a reflective metal such as aluminum, silver, chromium, or an alloy of aluminum, silver, and chromium.

The first sub-pixel electrode 191a may be smaller than the second sub-pixel electrode 191b.

The first sub-pixel electrode 191a and the second sub-pixel electrode 191b may neighbor each other in the column direction, their shapes may be substantially quadrangular, and they may include a cross-shaped stem including a horizontal stem 192 and a vertical stem 193 crossing the same. The first sub-pixel electrode 191a and the second sub-pixel electrode 191b are divided into four sub-regions by the horizontal stem 192 and the vertical stem 193, and a plurality of fine branches 194 may be in each sub-region.

Some of the fine branches 194 of the first sub-pixel electrode 191a and the second sub-pixel electrode 191b obliquely extend in the top left direction from the horizontal stem 192 or the vertical stem 193, and other fine branches 194 obliquely extends in the top right direction from the horizontal stem 192 or the vertical stem 193. Still other fine branches 194 obliquely extend in the bottom left direction from the horizontal stem 192 or the vertical stem 193, and the final fine branches 194 obliquely extend in the bottom right direction from the horizontal stem 192 or the vertical stem 193.

Each fine branch 194 may form an angle of about 40 degrees to about 45 degrees with respect to the gate line 121 or the horizontal stem 192. The fine branches 194 of two neighboring sub-regions may be orthogonal to each other.

A color filter 230, a light blocking member 220, an overcoat 240, and a common electrode 270 may be disposed on the second substrate 210 facing the first substrate 110. A liquid crystal layer 3 may be disposed between the first substrate 110 and the second substrate 210.

A configuration of a dummy pixel of a display device according to an example embodiment will now be described with reference to FIG. 16.

A gate line 121 and a dummy data line 171d crossing the gate line 121 may be disposed on the first substrate. A gate insulating layer may be disposed between the gate line 121 and the dummy data line 171d. That is, the gate line 121 may overlap the dummy data line 171d with the gate insulating layer.

The dummy data line 171d may extend substantially parallel to the data line 171. The dummy data line 171d may include a first dummy data line 171da and a second dummy data line 171db which are disposed on the both sides of the dummy pixel. The first dummy data line 171da may be disposed on the left of the dummy pixel electrode 191d, and the second dummy data line 171db may be disposed on the right of the dummy pixel electrode 191d. The first dummy data line 171da and the second dummy data line 171db float, and no signals are applied to the first and second dummy data lines 171da and 171db.

The first dummy data line 171da and the second dummy data line 171db include openings 921, 922, 961, and 962 that are disposed on a portion that is near the overlapping portion with the gate line 121.

The openings 921 and 922 of the first dummy data line 171da may include an upper opening 921 that is disposed on the upper side of the overlapping portion with the gate line 121 and a lower opening 922 that is disposed on the lower side of the overlapping portion with the gate line 121 in a plan view. The portions of the first dummy data line 171da are separated by the openings 921 and 922. For example, the portion of the first dummy data line 171da on the upper side of the upper opening 921 is separated from the portion of the first dummy data line 171da on the lower side of the upper opening 921. The portion of the first dummy data line 171da on the upper side of the lower opening 922 is separated from the portion of the first dummy data line 171da on the lower side of the lower opening 922. Hence, the portions of the first dummy data line 171da separated by the openings 921 and 922 of the first dummy data line 171da are electrically insulated from each other.

In the present example embodiment, the first dummy data line 171da includes openings 921 and 922 on the portion that is near the overlapping portion of the gate line 121, so that when a short-circuit is generated between the first dummy data line 171da and the gate line 121, the load of the gate signal may be minimized and the variation width of the gate output waveform may be minimized.

The openings 961 and 962 of the second dummy data line 171db may include an upper opening 961 on the upper side of the overlapping portion with the gate line 121 and a lower opening 962 on the lower side of the overlapping portion with the gate line 121 in a plan view. The portions of the second dummy data line 171db are separated by the openings 961 and 962. For example, the portion of the second dummy data line 171db on the upper side of the upper opening 961 is separated from the portion of the second dummy data line 171db on the lower side of the upper opening 961. The portion of the second dummy data line 171db on the upper side of the lower opening 962 is separated from the portion of the second dummy data line 171db on the lower side of the lower opening 962. Therefore, the upper and lower portions of the second dummy data line 171db that are separated by the openings 961 and 962 are electrically insulated from each other.

In the present example embodiment, the second dummy data line 171db includes the openings 961 and 962 on the portion that is near the overlapping portion with the gate line 121, so that the load of the gate signal may be minimized and the variation width of the gate output waveform may be minimized when a short-circuit is generated between the second dummy data line 171db and the gate line 121.

A first dummy gate electrode 124da and a second dummy gate electrode 124db protruding from the gate line 121 may be further disposed in the dummy pixel area. A first dummy semiconductor 154da overlapping the first dummy gate electrode 124da and a second dummy semiconductor 154db overlapping the second dummy gate electrode 124db may be further disposed. A first dummy source electrode 173da protruding from the first dummy data line 171da, and a first dummy drain electrode 175da separated from the first dummy source electrode 173da may further be disposed. The first dummy source electrode 173da and the first dummy drain electrode 175da may overlap the first dummy gate electrode 124da. A second dummy source electrode 173db protruding from the second dummy data line 171db and a second dummy drain electrode 175db separated from the second dummy source electrode 173db may further be disposed.

The second dummy source electrode 173db and the second dummy drain electrode 175db may overlap the second dummy gate electrode 124db. A dummy pixel electrode 191d may be disposed between the first dummy data line 171da and the second dummy data line 171db. The dummy pixel electrode 191d may include a first dummy sub-pixel electrode 191da and a second dummy sub-pixel electrode 191db. The first dummy sub-pixel electrode 191da may overlap the first dummy drain electrode 175da, and it is not connected to the first dummy drain electrode 175da. The second dummy sub-pixel electrode 191db may overlap the second dummy drain electrode 175db, and it is not connected to the second dummy drain electrode 175db. The dummy pixel electrode 191d floats, and no voltage is applied to the dummy pixel electrode 191d.

The first dummy data line 171da, the second dummy data line 171db, the first and second dummy gate electrodes 124da and 124db, the first and second dummy semiconductors 154da and 154db, the first and second dummy source electrodes 173da and 173db, the first and second dummy drain electrodes 175da and 175db, and the first and second dummy sub-pixel electrodes 191da and 191db may have similar planar shapes to the first data line 171a, the second data line 171b, the first and second gate electrodes 124a and 124b, the first and second semiconductors 154a and 154b, the first and second source electrodes 173a and 173b, the first and second drain electrodes 175a and 175b, and the first and second sub-pixel electrodes 191a and 191b.

The number and the disposal shapes of the above-described switching elements are modifiable in various ways. The method for driving a display device is modifiable in many ways according to various methods for connecting switching elements. The form of the above-described pixel electrode and the disposal shape of the pixel are modifiable in many ways.

Further, the liquid crystal display in which the screen displays images by driving liquid crystal between two substrates has been described, and the present example embodiment is not limited thereto. The display device according to the present example embodiment may be configured with an organic light emitting device, an electrophoretic display, or an electrowetting display device. In addition, it may be configured with next-generation display devices such as a micro light emitting diode (Micro LED) display device, a quantum dot light emitting diode (QLED) display device, or a quantum dot organic light emitting diode (QD-OLED) display device.

While this disclosure has been described in connection with what is presently considered to be practical example embodiments, it is to be understood that the present disclosure is not limited to the disclosed embodiments, but, on the contrary, is intended to cover various modifications and equivalent arrangements included within the spirit and scope of the appended claims.

What is claimed is:

1. A display device comprising:
 a substrate;
 a gate line on the substrate;
 a data line crossing the gate line;
 a pixel connected to the gate line and the data line; and
 a dummy data line disposed on an edge of the substrate and crossing the gate line,
 wherein the dummy data line includes openings that are disposed on a portion that is near an overlapping portion with the gate line,
 portions of the dummy data line separated by the openings are electrically insulated from each other, and
 an entirety of the openings does not overlap the gate line.

2. The display device of claim 1, wherein
 the openings of the dummy data line include:
 an upper opening disposed on an upper side of an overlapping portion with the gate line in a plan view; and
 a lower opening disposed on a lower side of an overlapping portion with the gate line in a plan view.

3. The display device of claim 1, wherein
 a number of openings of the dummy data line is greater than a number of the gate lines.

4. The display device of claim 3, wherein
 the number of openings of the dummy data line is about twice the number of the gate lines.

5. The display device of claim 1, further comprising
 a gate insulating layer between the gate line and the data line and between the gate line and the dummy data line,
 wherein the gate line overlaps the data line with the gate insulating layer therebetween, and
 the gate line overlaps the dummy data line with the gate insulating layer therebetween.

6. The display device of claim 5, wherein
 the gate line extends in a first direction,
 the data line extends in a second direction perpendicular to the first direction, and
 the dummy data line extends in the second direction.

7. The display device of claim 1, further comprising
 a dummy pixel disposed on an edge of the substrate and disposed between the data line and the dummy data line,
 wherein the dummy pixel floats.

8. The display device of claim 7, wherein
 the dummy data line floats.

9. The display device of claim 1, wherein
 the display device includes a plurality of gate lines, a plurality of data lines, and a plurality of pixels,
 the pixels are disposed in a matrix form,
 each of the gate lines are connected to pixels in the same row from among the pixels, and
 each of the data lines are alternately connected to a pixel on a left of the data line and a pixel on a right of the data line from among the pixels.

10. The display device of claim 9, wherein
 data voltages with different polarities are applied to data lines that are adjacent to each other from among the data lines.

11. The display device of claim 1, further comprising
 a dummy reference voltage line disposed on an edge of the substrate, and crossing the gate line,
 wherein the dummy reference voltage line includes openings disposed on a portion that is near an overlapping portion with the gate line, and
 portions of the dummy reference voltage line separated by the openings are electrically insulated from each other.

12. The display device of claim 1, wherein
 the data line includes a first data line and a second data line,
 the dummy data line includes a first dummy data line and a second dummy data line, and
 the first dummy data line and the second dummy data line respectively include an opening disposed on a portion that is near an overlapping portion with the gate line.

13. A display device comprising:
 a substrate;
 a gate line on the substrate;
 a data line and a reference voltage line crossing the gate line;
 a pixel connected to the gate line, the data line, and the reference voltage line; and
 a dummy reference voltage line disposed on an edge of the substrate, and crossing the gate line,
 wherein the dummy reference voltage line includes openings disposed on a portion that is near the overlapping portion with the gate line, and
 portions of the dummy reference voltage line separated by the openings are electrically insulated from each other.

14. The display device of claim 13, further comprising
 a dummy data line disposed on an edge of the substrate and crossing the gate line,
 wherein the dummy reference voltage line is disposed between the dummy data line and the data line.

15. The display device of claim 14, wherein
 the dummy data line includes openings disposed on a portion that is near an overlapping portion with the gate line, and
 portions of the dummy data line separated by the openings are electrically insulated from each other.

16. The display device of claim 15, further comprising
 a dummy pixel disposed on an edge of the substrate and disposed between the data line and the dummy data line,
 wherein the dummy pixel floats.

17. The display device of claim 16, wherein
 the dummy reference voltage line and the dummy data line float.

18. The display device of claim 13, wherein
 the openings of the dummy reference voltage line include
 an upper opening disposed on an upper side of an overlapping portion with the gate line in a plan view, and
 a lower opening disposed on a lower side of an overlapping portion with the gate line in a plan view.

19. A display device comprising:
 a substrate;
 a gate line and a data line disposed on the substrate and crossing each other;

a reference voltage line disposed on the substrate and receiving a predetermined voltage;
a first transistor and a second transistor connected to the gate line and the data line;
a third transistor connected to the gate line, the second transistor, and the reference voltage line;
a first sub-pixel electrode connected to the first transistor;
a second sub-pixel electrode connected to the second transistor; and
a dummy data line disposed on an edge of the substrate and crossing the gate line,
wherein the dummy data line includes openings disposed on a portion that is near an overlapping portion with the gate line,
portions of the dummy data line separated by the openings are electrically insulated from each other, and
an entirety of the openings does not overlap the gate line.

20. The display device of claim 19, further comprising
a dummy reference voltage line disposed on an edge of the substrate and crossing the gate line,
wherein the dummy reference voltage line includes an opening disposed on a portion that is near an overlapping portion with the gate line, and
portions of the dummy reference voltage line separated by the openings are electrically insulated from each other.

* * * * *